US012414409B2

(12) United States Patent
Shin et al.

(10) Patent No.: US 12,414,409 B2
(45) Date of Patent: Sep. 9, 2025

(54) DISPLAY DEVICE AND METHOD FOR FABRICATING THE SAME

(71) Applicant: Samsung Display Co., LTD., Yongin-si (KR)

(72) Inventors: Dong Hee Shin, Asan-si (KR); No Kyung Park, Hwaseong-si (KR); Sun Kwun Son, Suwon-si (KR); Na Hyeon Cha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 414 days.

(21) Appl. No.: 18/096,958

(22) Filed: Jan. 13, 2023

(65) Prior Publication Data

US 2023/0246139 A1    Aug. 3, 2023

(30) Foreign Application Priority Data

Jan. 14, 2022    (KR) .................. 10-2022-0005786

(51) Int. Cl.
*H01L 25/075*      (2006.01)
*H10H 20/01*       (2025.01)
(Continued)

(52) U.S. Cl.
CPC ..... *H10H 20/8316* (2025.01); *H01L 25/0753* (2013.01); *H10H 20/01* (2025.01);
(Continued)

(58) Field of Classification Search
CPC .................. H01L 25/0753; H10H 20/8316; H10H 20/01; H10H 20/833; H10H 20/857;
(Continued)

(56) References Cited

U.S. PATENT DOCUMENTS

2010/0039016 A1    2/2010   Lhee et al.
2016/0351755 A1*  12/2016   Lee .................. H10H 20/856
(Continued)

FOREIGN PATENT DOCUMENTS

JP    2020-008751      1/2020
KR    10-2017-0049117  5/2017
(Continued)

*Primary Examiner* — Omar F Mojaddedi
(74) *Attorney, Agent, or Firm* — Womble Bond Dickinson (US) LLP

(57) ABSTRACT

A display device includes first and second electrodes, a first insulating layer on the first and second electrodes, light emitting elements on the first and second electrodes, a bank layer on the first insulating layer and including an opening, a contact electrode layer on the light emitting elements and the bank layer and including a first contact electrode and a second contact electrode spaced apart from each other on the light emitting elements, an intermediate layer on the contact electrode layer and including a first pattern portion on the first contact electrode and a second pattern portion spaced apart from the first pattern portion and on the second contact electrode, and a connection electrode layer on the intermediate layer and including a first connection electrode on the first pattern portion and a second connection electrode spaced apart from the first connection electrode and on the second pattern portion.

20 Claims, 20 Drawing Sheets

PML: P1, P2, P3, P4
BNL: BNP, BP1, BP2, BP3
BRL: BR1, BR2, BR3, BR4

(51) Int. Cl.
  *H10H 20/83*     (2025.01)
  *H10H 20/831*    (2025.01)
  *H10H 20/833*    (2025.01)
  *H10H 20/84*     (2025.01)
  *H10H 20/857*    (2025.01)

(52) U.S. Cl.
  CPC ........ *H10H 20/833* (2025.01); *H10H 20/857* (2025.01); *H10H 20/032* (2025.01)

(58) Field of Classification Search
  CPC .. H10H 20/032; H10H 20/0364; H10H 20/84; H10H 20/831
  See application file for complete search history.

(56)         References Cited

U.S. PATENT DOCUMENTS

| 2017/0162606 | A1* | 6/2017 | Yan ................ H10D 30/6757 |
| 2018/0012950 | A1* | 1/2018 | Jung ................ H10K 50/805 |
| 2018/0019369 | A1* | 1/2018 | Cho ................ H01L 25/0753 |
| 2018/0061868 | A1* | 3/2018 | Na ................ H10D 86/423 |
| 2020/0273906 | A1* | 8/2020 | Li ................ H10H 29/142 |
| 2021/0020721 | A1* | 1/2021 | Kwack ................ H10K 59/122 |
| 2022/0069165 | A1  | 3/2022 | Shin et al. |

FOREIGN PATENT DOCUMENTS

| KR | 10-2021-0095774 | 8/2021 |
| KR | 10-2021-0098313 | 8/2021 |

* cited by examiner

BRL: BR1, BR2, BR3
BNL: BNP, BP1, BP2, BP3
CNL: CNE1, CNE2, CNE3

DISPLAY DEVICE AND METHOD FOR FABRICATING THE SAME

CROSS-REFERENCE TO RELATED APPLICATION(S)

This application claims priority to and benefits of Korean Patent Application No. 10-2022-0005786 under 35 U.S.C. § 119, filed on Jan. 14, 2022 in the Korean Intellectual Property Office, the entire contents of which are incorporated herein by reference.

BACKGROUND

1. Technical Field

The disclosure relates to a display device and a method for fabricating the same.

2. Description of the Related Art

The importance of display devices has steadily increased with the development of multimedia technology. In response thereto, various types of display devices such as an organic light emitting display (OLED), a liquid crystal display (LCD) and the like have been used.

As a device for displaying an image of a display device, there is a self-light emitting display device including a light emitting element. The self-light emitting display device may include an organic light emitting display device using an organic material as a light emitting material as a light emitting element, an inorganic light emitting display device using an inorganic material as a light emitting material, or the like.

SUMMARY

Aspects of the disclosure provide a display device in which a fabricating process is simplified and a repair process is readily accomplished.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment of the disclosure, a display device may include a first electrode disposed on a substrate, a second electrode spaced apart from the first electrode, a first insulating layer disposed on the first electrode and the second electrode, light emitting elements disposed on the first electrode and the second electrode on the first insulating layer, a bank layer disposed on the first insulating layer and including an opening in which the light emitting elements may be disposed, a contact electrode layer disposed on the light emitting element and the bank layer, the contact electrode layer including a first contact electrode and a second contact electrode that are spaced apart from each other on the light emitting element, an intermediate layer disposed on the contact electrode layer and including a first pattern portion disposed on the first contact electrode and a second pattern portion spaced apart from the first pattern portion and disposed on the second contact electrode, and a connection electrode layer disposed on the intermediate layer and including a first connection electrode disposed on the first pattern portion and a second connection electrode spaced apart from the first connection electrode and disposed on the second pattern portion. Side edges of the first contact electrode and the second contact electrode facing each other may be parallel to side edges of the first pattern portion and the second pattern portion facing each other.

The side edges of the first pattern portion and the second pattern portion facing each other may be parallel to side edges of the first connection electrode and the second connection electrode facing each other.

Outer side edges opposite to the side edges of the first contact electrode and the second contact electrode facing each other may be parallel to outer side edges opposite to the side edges of the first pattern portion and the second pattern portion facing each other.

Each of the contact electrode layer and the connection electrode layer may include at least one of ITO, IZO, ITZO, and aluminum, and the intermediate layer may include an insulating material.

The intermediate layer may include an organic insulating material, the contact electrode layer may include IZO, and the connection electrode layer may include ITO.

The intermediate layer may include an inorganic insulating material.

A gap between the first contact electrode and the second contact electrode may be less than or equal to a gap between the first connection electrode and the second connection electrode.

The first contact electrode may be in contact with a first end of the light emitting elements, and the second contact electrode may be in contact with a second end of the light emitting elements.

The first contact electrode may be in contact with the first electrode through a first contact portion penetrating the first insulating layer without overlapping the bank layer, and the second contact electrode may be in contact with the second electrode through a second contact portion penetrating the first insulating layer without overlapping the bank layer.

The first contact electrode may comprise a first contact portion in contact with the light emitting elements, and a second contact portion separated from the first contact portion and in contact with the first electrode, and the first connection electrode may be in contact with each of the first contact portion and the second contact portion through a contact hole penetrating the first pattern portion.

The bank layer may include a first barrier wall disposed on the first electrode, a second barrier wall spaced apart from the first barrier wall with the opening therebetween and disposed on the second electrode, and a bank portion having a thickness greater than a thickness of the first barrier wall and the second barrier wall and surrounding a portion in which the light emitting may be disposed, and the light emitting elements may be disposed between the first barrier wall and the second barrier wall.

The first barrier wall, the second barrier wall, and the bank portion may be integrated with each other.

The first contact electrode may be in contact with the light emitting elements and disposed directly on the first barrier wall and the bank portion, and the second contact electrode may be in contact with the light emitting elements and disposed directly on the second barrier wall and the bank portion.

Each of the first pattern portion and the first connection electrode may overlap the first barrier wall in a thickness direction, and each of the second pattern portion and the second connection electrode may overlap the second barrier wall in the thickness direction.

A width of the opening between the first and second barrier walls may be greater than a gap between the first and second contact electrodes.

According to an embodiment of the disclosure, a method for fabricating a display device may include preparing a first electrode and a second electrode that are spaced apart from each other, a bank layer including a first barrier wall disposed on the first electrode and a second barrier wall disposed on the second electrode, and light emitting elements having ends disposed on the first electrode and the second electrode between the first and second barrier walls, forming a contact electrode material layer disposed on the light emitting elements and the bank layer, an insulating material layer disposed on the contact electrode material layer, and a connection electrode material layer disposed on the insulating material layer, patterning the connection electrode material layer and the insulating material layer to remove a portion overlapping the light emitting elements, and forming a connection electrode layer including connection electrodes spaced apart from each other, and an intermediate layer including pattern portions spaced apart from each other, and patterning the contact electrode material layer using the connection electrode layer as a mask to form a contact electrode layer in contact with the light emitting elements and including contact electrodes spaced apart from each other.

The insulating material layer may contain an organic insulating material, and a drying process of the insulating material layer may be performed after the patterning of the connection electrode material layer and the insulating material layer.

The connection electrode material layer may contain a-ITO, and the contact electrode material layer may contain IZO.

Facing side edges of the connection electrodes spaced apart from each other may be parallel to facing side edges of the pattern portions spaced apart from each other, and facing side edges of the contact electrodes spaced apart from each other.

A gap between the contact electrodes spaced apart from each other may be smaller than a gap between the first barrier wall and the second barrier wall.

A display device according to an embodiment may include a contact electrode layer, an intermediate layer, and a connection electrode layer sequentially disposed on a light emitting element. In the display device, in case that a disconnection defect of the contact electrode layer occurs, a repair process through the connection electrode layer may be immediately possible, so that the repair process may be facilitated.

However, the effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
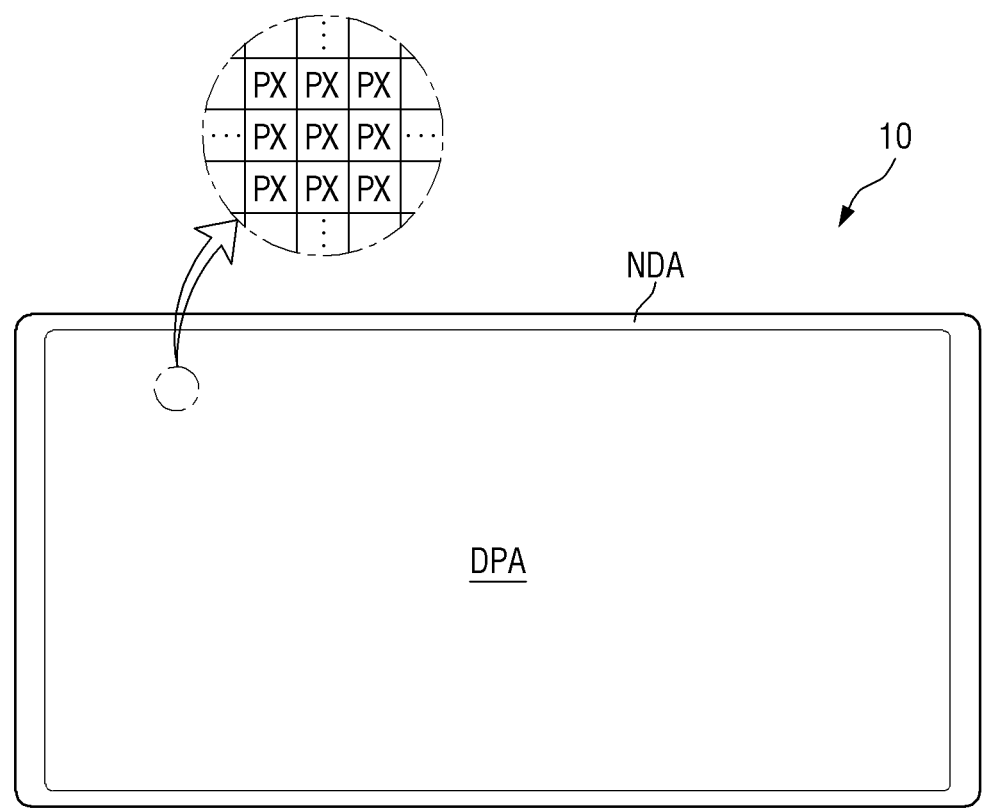
FIG. 1 is a schematic plan view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well, unless the context clearly indicates otherwise.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

When an element is described as "not overlapping" or to "not overlap" (e.g., "without overlapping") another element, this may include that the elements are spaced apart from each other, offset from each other, or set aside from each other or any other suitable term as would be appreciated and understood by those of ordinary skill in the art.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view of a display device according to an embodiment.

Referring to FIG. 1, a display device 10 may display a moving image or a still image. The display device 10 may refer to any electronic device providing a display screen. Examples of the display device 10 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 10 may include a display panel which provides a display screen. Examples of the display panel may include an inorganic light emitting diode display panel, an organic light emitting display panel, a quantum dot light emitting display panel, a plasma display panel and a field emission display panel. In the following description, a case where an inorganic light emitting diode display panel may be applied as a display panel will be disclosed, but the disclosure is not limited thereto, and other display panels may be applied within the same technical spirit.

The shape of the display device 10 may be variously changed. For example, the display device 10 may have a shape such as a rectangular shape elongated in a horizontal direction, a rectangular shape elongated in a vertical direction, a square shape, a quadrilateral shape with rounded corners (vertices), another polygonal shape and a circular shape. The shape of a display area DPA of the display device 10 may also be similar to the overall shape of the display device 10. FIG. 1 illustrates the display device 10 having a rectangular shape elongated in a second direction DR2.

The display device 10 may include the display area DPA and a non-display area NDA. The display area DPA may be an area where a screen can be displayed, and the non-display area NDA may be an area where a screen may not be displayed. The display area DPA may also be referred to as an active region, and the non-display area NDA may also be referred to as a non-active region. The display area DPA may substantially occupy the center of the display device 10.

The display area DPA may include pixels PX. The pixels PX may be arranged in a matrix. The shape of each pixel PX may be a rectangular or square shape in plan view. However, the disclosure is not limited thereto, and it may be a rhombic shape in which each side may be inclined with respect to a direction. The pixels PX may be arranged in a stripe type or an island type. In addition, each of the pixels PX may include one or more light emitting elements that emit light of a specific wavelength band to display a specific color.

The non-display area NDA may be disposed around the display area DPA. The non-display area NDA may completely or partially surround the display area DPA. The display area DPA may have a rectangular shape, and the non-display area NDA may be disposed adjacent to four sides of the display area DPA. The non-display area NDA may form a bezel of the display device 10. Wires or circuit drivers included in the display device 10 may be disposed in the non-display area NDA, or external devices may be mounted thereon.

Figure 2:
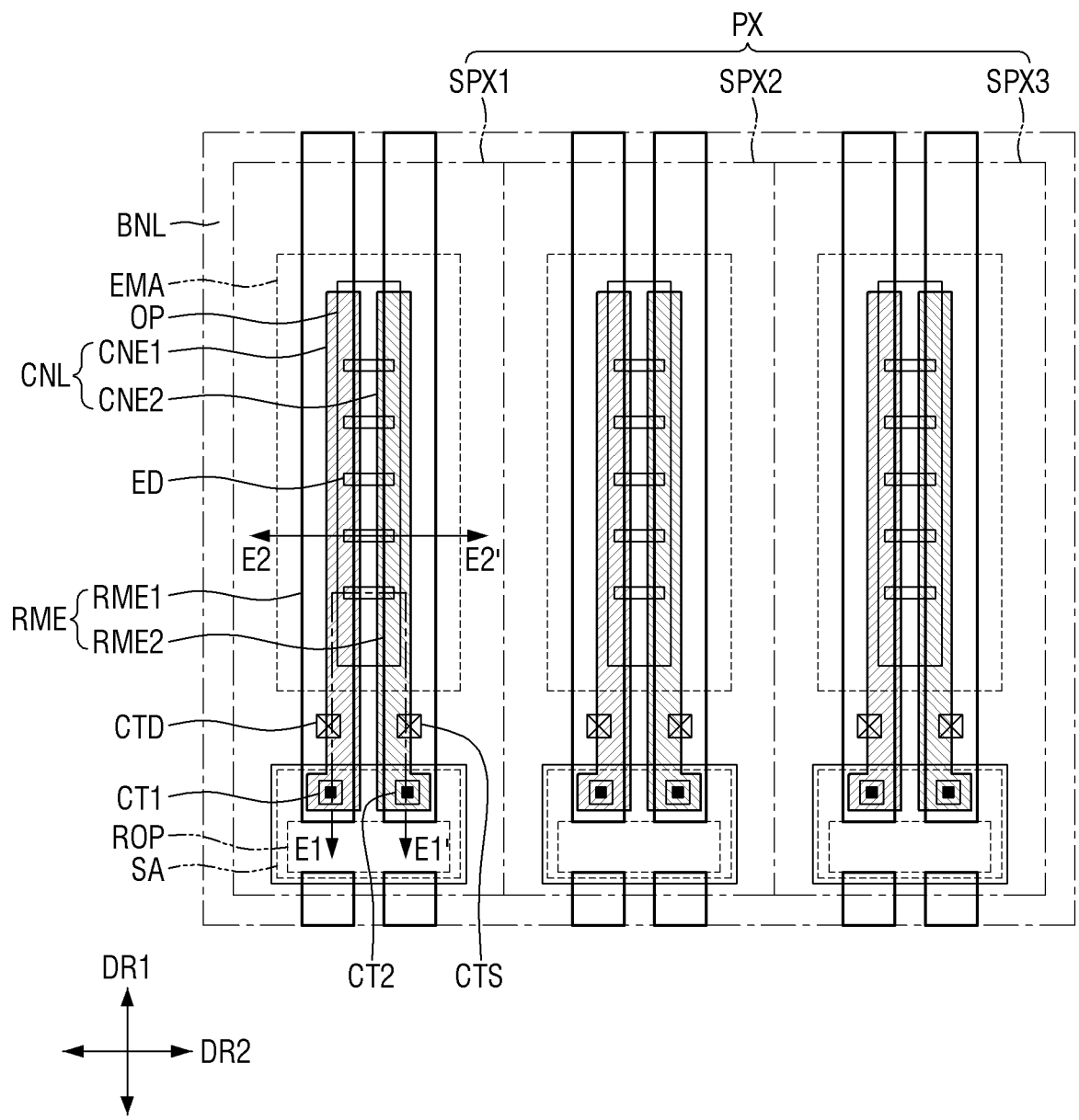
FIG. 2 is a schematic plan view illustrating a pixel of a display device according to an embodiment.

FIG. 2 is a schematic plan view illustrating a pixel of a display device according to an embodiment.

FIG. 2 illustrates a planar disposition of electrodes RME (RME1 and RME2), a bank layer BNL, light emitting elements ED, and contact electrode layers CNL (CNE1 and CNE2) that may be disposed in a pixel PX of the display device 10.

Referring to FIG. 2, each of the pixels PX of the display device 10 may include sub-pixels SPXn. For example, a pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. However, the disclosure is not limited thereto, and the sub-pixels SPXn may emit light of the same color. In an embodiment, each of the sub-pixels SPXn may emit blue light. Although it is illustrated in the drawing that a pixel PX includes three sub-pixels SPXn, the disclosure is not limited thereto, and the pixel PX may include a larger number of sub-pixels SPXn.

Each sub-pixel SPXn of the display device 10 may include an emission area EMA and a non-emission area. The emission area EMA may be an area in which the light emitting element ED may be disposed to emit light of a specific wavelength band. The non-emission area may be a region in which the light emitting element ED may not be disposed and a region from which light may not be emitted because light emitted from the light emitting element ED does not reach it.

The emission area EMA may include the region in which the light emitting element ED may be disposed, and a region adjacent to the light emitting element ED in which the lights emitted from the light emitting element ED may be emitted. For example, the emission area EMA may further include a region in which the light emitted from the light emitting element ED may be reflected or refracted by another member and emitted. The light emitting elements ED may be disposed in each sub-pixel SPXn, and the emission area may be formed to include an area where the light emitting elements ED may be disposed and an area adjacent thereto.

Although it is shown in the drawing that the sub-pixels SPXn have the emission areas EMA that may be substantially identical in size, the disclosure is not limited thereto. In some embodiments, the emission areas EMA of the sub-pixels SPXn may have different sizes according to a color or wavelength band of light emitted from the light emitting element ED disposed in each sub-pixel.

Each sub-pixel SPXn may further include a sub-region SA disposed in the non-emission area. The sub-region SA of the corresponding sub-pixel SPXn may be disposed on the lower side of the emission area EMA, which may be the other side in the first direction DR1. The emission area EMA and the sub-region SA may be alternately arranged along the first direction DR1, and the sub-region SA may be disposed between the emission areas EMA of different sub-pixels SPXn spaced apart from each other in the first direction DR1. For example, the emission area EMA and the sub-region SA may be alternately arranged in the first direction DR1, and each of the emission area EMA and the sub-region SA may be repeatedly arranged in the second direction DR2. However, the disclosure is not limited thereto, and the arrangement of the emission areas EMA and the sub-regions SA in the pixels PX may be different from that shown in FIG. 2.

Light may not be emitted from the sub-region SA because the light emitting element ED may not be disposed in the sub-region SA, but an electrode RME disposed in each sub-pixel SPXn may be partially disposed in the sub-region SA. The electrodes RME disposed in different sub-pixels SPXn may be disposed to be separated at a separation portion ROP of the sub-region SA.

The display device 10 may include electrodes RME (RME1 and RME2), the bank layer BNL, the light emitting elements ED, and the contact electrode layer CNL (CNE1 and CNE2). As will be described later with reference to other drawings, the display device 10 may include an intermediate layer PML in FIG. 3 and a connection electrode layer BRL (BR1 and BR2 in FIG. 4) disposed on the contact electrode layer CNL.

The electrodes RME (RME1 and RME2) may have a shape extending in a direction and may be disposed for each sub-pixel SPXn. The electrodes RME1 and RME2 may extend in the first direction DR1 to be disposed across the emission area EMA of the sub-pixel SPXn and the sub-region SA, and may be disposed to be spaced apart from each other in the second direction DR2. The electrodes RME may be electrically connected to the light emitting element ED to be described later, but the disclosure is not limited thereto. The electrodes RME may not be electrically connected to the light emitting element ED.

The display device 10 may include the first electrode RME1 and the second electrode RME2 arranged in each sub-pixel SPXn. The first electrode RME1 may be located on the left side with respect to the center of the emission area EMA, and the second electrode RME2 may be located on the right side with respect to the center of the emission area EMA while being spaced apart from the first electrode RME1 in the second direction DR2. The first electrode RME1 and the second electrode RME2 of different sub-pixels SPXn may be separated with respect to the separation portion ROP located in the sub-region SA of a sub-pixel SPXn.

Although it is illustrated in the drawing that two electrodes RME have a shape extending in the first direction DR1 for each sub-pixel SPXn, the disclosure is not limited thereto. For example, the display device 10 may have a shape in which a larger number of electrodes RME may be disposed in a sub-pixel SPXn or the electrodes RME may be partially bent and have different widths depending on positions.

The bank layer BNL may be disposed over the entire surface of the display area DPA and may expose or surround a portion of the sub-pixels SPXn. For example, the bank layer BNL may surround an opening OP disposed in the emission area EMA of the sub-pixel SPXn and the sub-region SA disposed at a side of the emission area EMA. Alternatively, the bank layer BNL may be disposed on the entire surface of the display area DPA and include the opening OP exposing a portion of the emission area EMA of the sub-pixel SPXn.

As will be described later, the bank layer BNL may include a bank portion BNP in FIG. 5 and barrier walls BP1 and BP2 in FIG. 5 having a height lower than that of the bank portion BNP. The bank portion BNP may be disposed at the boundary between the sub-pixels SPXn adjacent in the first direction DR1 and the second direction DR2, and may also be disposed at the boundary between the emission area EMA and the sub-region SA. The sub-pixels SPXn, the emission area EMA, and the sub-region SA of the display device 10 may be the areas distinguished by the arrangement of the bank portion BNP. The gaps between the sub-pixels SPXn, the emission areas EMA, and the sub-regions SA may vary depending on the width of the bank portion BNP. The bank portion BNP may overlap the electrodes RME1 and RME2 at the boundary of the sub-pixel SPXn and between the emission area EMA and the sub-region SA.

The barrier walls BP1 and BP2 of the bank layer BNL may be integrated with the bank portion BNP and disposed in the emission area EMA of each sub-pixel SPXn. The barrier walls BP1 and BP2 may be spaced apart from each other with the opening OP disposed in the emission area EMA interposed therebetween. The light emitting elements ED may be disposed in the opening OP formed by the barrier walls BP1 and BP2. The barrier walls BP1 and BP2 may overlap the electrodes RME1 and RME2 in the emission area EMA of the sub-pixel SPXn, respectively.

The light emitting elements ED may be arranged in the emission area EMA. The light emitting elements ED may be disposed in the opening OP of the bank layer BNL, and may be arranged to be spaced apart from each other in the first direction DR1. In an embodiment, the light emitting elements ED may have a shape extending in a direction, and both ends thereof may be disposed on different electrodes RME. For example, the light emitting element ED may be disposed such that the first end may be disposed on the first electrode RME1 and the second end may be disposed on the second electrode RME2. The length of the light emitting element ED may be greater than the gap between the electrodes RME spaced apart from each other in the second direction DR2. The extension direction of the light emitting elements ED may be substantially perpendicular to the first direction DR1 in which the electrodes RME extend. However, the disclosure is not limited thereto, and the light emitting element ED may extend in the second direction DR2 or in a direction oblique to the second direction DR2.

The contact electrode layer CNL may be disposed on the light emitting element ED and the bank layer BNL. The contact electrodes CNE may have a shape extending in a direction, and may be disposed to be spaced apart from each other. Each of the contact electrodes CNE may be in contact with the light emitting element ED, and may be electrically connected to the electrodes RME.

The contact electrode CNE may include a first contact electrode CNE1 and a second contact electrode CNE2 disposed in each sub-pixel SPXn. The first contact electrode CNE1 may have a shape extending in the first direction DR1 and may be disposed on the first electrode RME1. The first contact electrode CNE1 may partially overlap the first electrode RME1 and may be disposed from the emission area EMA to the sub-region SA. The second contact electrode CNE2 may have a shape extending in the first direction DR1 and may be disposed on the second electrode RME2. The second contact electrode CNE2 may partially overlap the second electrode RME2 and may be disposed from the emission area EMA to the sub-region SA. The first contact electrode CNE1 may be in contact with the first end of the light emitting element ED, and the second contact electrode CNE2 may be in contact with the second end of the light emitting element ED.

In accordance with an embodiment, in the display device 10, the contact electrodes CNE may be in contact with the electrode RME through the contact portions CT1 and CT2 disposed in the sub-region SA. The first contact electrode CNE1 may be in contact with the first electrode RME1 through the first contact portion CT1 in the sub-region SA. The second contact electrode CNE2 may be in contact with the second electrode RME2 through the second contact portion CT2 in the sub-region SA. Each of the contact electrodes CNE may be electrically connected to a first voltage line VL1 or a second voltage line VL2 through the electrode RME. The first contact electrode CNE1 may be electrically connected to the first transistor T1 and the first voltage line VL1 through the first electrode RME1 to be applied with a first power voltage, and the second contact electrode CNE2 may be electrically connected to the second voltage line VL2 through the second electrode RME2 to be applied with a second power voltage. Each contact electrode CNE may be in contact with the light emitting element ED in the emission area EMA to transmit the power voltage to the light emitting element ED.

Figure 3:
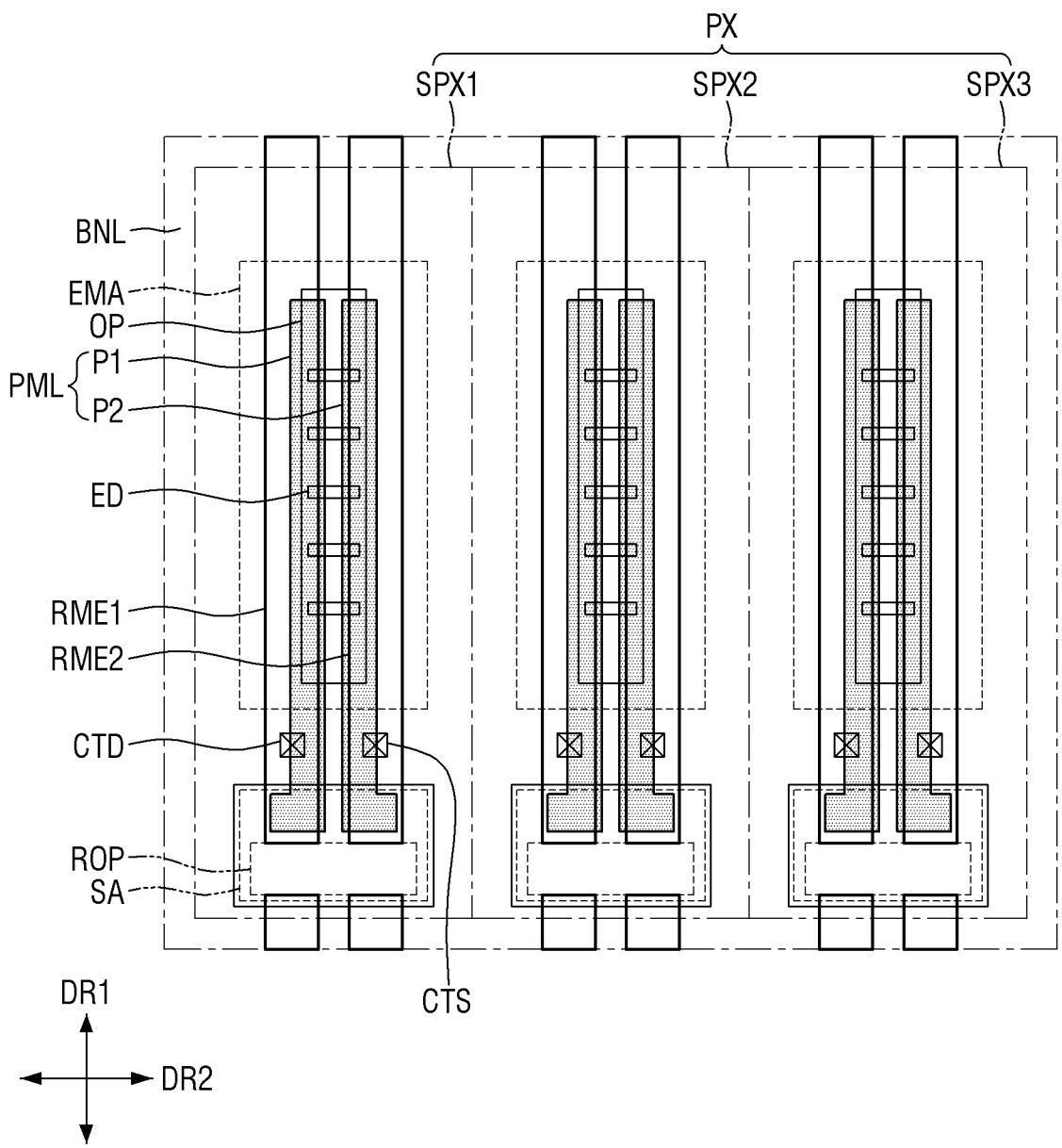
FIG. 3 is a schematic diagram illustrating a planar disposition of electrodes and a second insulating layer disposed in a pixel of FIG. 2.
Figure 4:
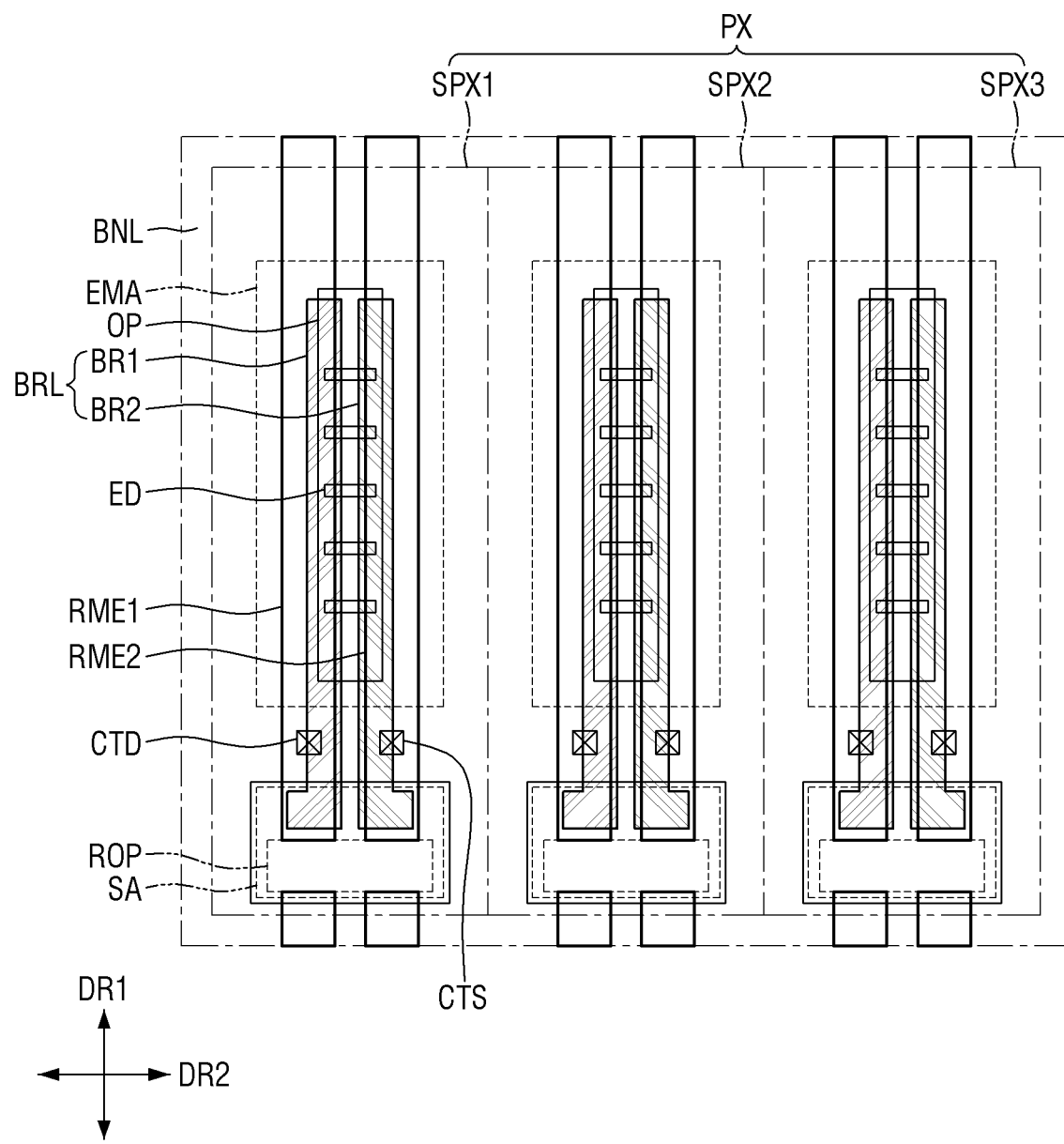
FIG. 4 is a schematic diagram illustrating a planar disposition of electrodes and a connection electrode layer disposed in a pixel of FIG. 2.

FIG. 3 is a schematic diagram illustrating a planar disposition of electrodes and a second insulating layer disposed in a pixel of FIG. 2. FIG. 4 is a schematic diagram illustrating a planar disposition of electrodes and a connection electrode layer disposed in a pixel of FIG. 2.

FIG. 3 illustrates a relative planar disposition of the intermediate layer PML, the electrodes RME1 and RME2, and the bank layer BNL disposed in a pixel PX. FIG. 4 illustrates a relative planar disposition of the connection electrode layer BRL (BR1 and BR2), the electrodes RME1 and RME2, and the bank layer BNL disposed in a pixel PX.

Referring to FIGS. 3 and 4 in addition to FIG. 2, the display device 10 according to an embodiment may include the connection electrode layer BRL disposed on the contact electrode layer CNL, and the intermediate layer PML disposed between the contact electrode layer CNL and the connection electrode layer BRL. Each of the intermediate layer PML and the connection electrode layer BRL may be disposed in the same pattern as the contact electrode layer CNL in plan view. The contact electrode layer CNL, the intermediate layer PML, and the connection electrode layer BRL may overlap each other in a thickness direction and may be disposed in substantially the same pattern.

The intermediate layer PML may be disposed on the connection electrode layer CNL. The intermediate layer PML may include a first pattern portion P1 and a second pattern portion P2, each of which may be disposed in a pattern extending in the first direction DR1. The first pattern portion P1 may be disposed on the first contact electrode CNE1, and the second pattern portion P2 may be disposed on the second contact electrode CNE2. As each of the contact electrodes CNE1 and CNE2 may be disposed from the emission area EMA to the sub-region SA, the intermediate layer PML may also be disposed over the emission area EMA and the sub-region SA. A portion of the intermediate layer PML may overlap the bank layer BNL.

The connection electrode layer BRL may be disposed on the intermediate layer PML. Similarly to the contact electrode layer CNL, the connection electrode layer BRL may include a first connection electrode BR1 and a second connection electrode BR2, each of which may extend in the first direction DR1. The first connection electrode BR1 may be disposed on the first pattern portion P1 of the intermediate layer PML to overlap the first contact electrode CNE1, and the second connection electrode BR2 may be disposed on the second pattern portion P2 of the intermediate layer PML to overlap the second contact electrode CNE2. As each of the contact electrodes CNE1 and CNE2 may be disposed from the emission area EMA to the sub-region SA, the connection electrodes BR1 and BR2 of the connection electrode layer BRL may be disposed over the emission area EMA and the sub-region SA. A portion of the connection electrodes BR1 and BR2 may overlap the bank layer BNL.

According to an embodiment, the contact electrodes CNE1 and CNE2 of the contact electrode layer CNL and the connection electrodes BR1 and BR2 of the connection electrode layer BRL may each include a conductive material. The contact electrodes CNE1 and CNE2 may be in contact with the electrode RME and the light emitting element ED to be electrically connected thereto. The connection electrodes BR1 and BR2 of the connection electrode layer BRL may be disposed in an insulated state from the contact electrodes CNE1 and CNE2 with the intermediate layer PML interposed therebetween. However, in case that a portion of the contact electrodes CNE1 and CNE2 is disconnected, the connection electrodes BR1 and BR2 may be electrically connected to the contact electrodes CNE1 and CNE2. In case that a defect occurs in the contact electrodes CNE1 and CNE2, the connection electrodes BR1 and BR2 may perform a repair process to provide an electrical connection path of the contact electrodes CNE1 and CNE2.

Hereinafter, the stacked structure of the display device 10 and the disposition of the contact electrode layer CNL, the intermediate layer PML, and the connection electrode layer BRL will be described with reference to other drawings.

Figure 5:
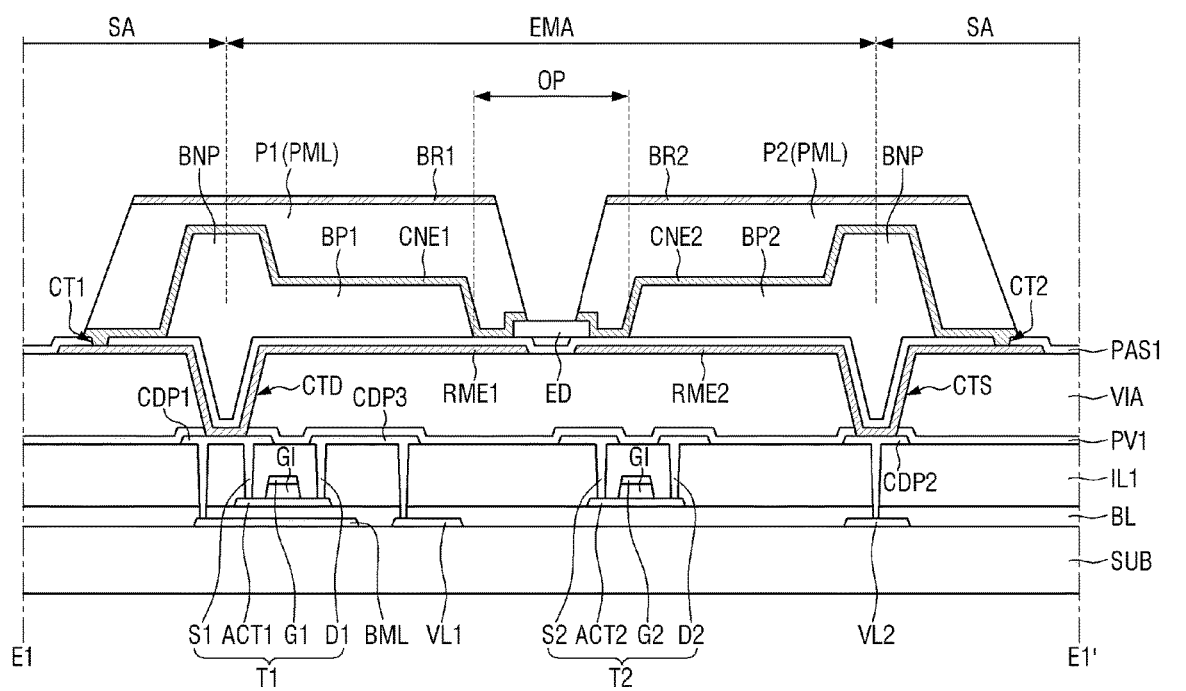
FIG. 5 is a schematic cross-sectional view taken along line E1-E1' of FIG. 2.
Figure 6:
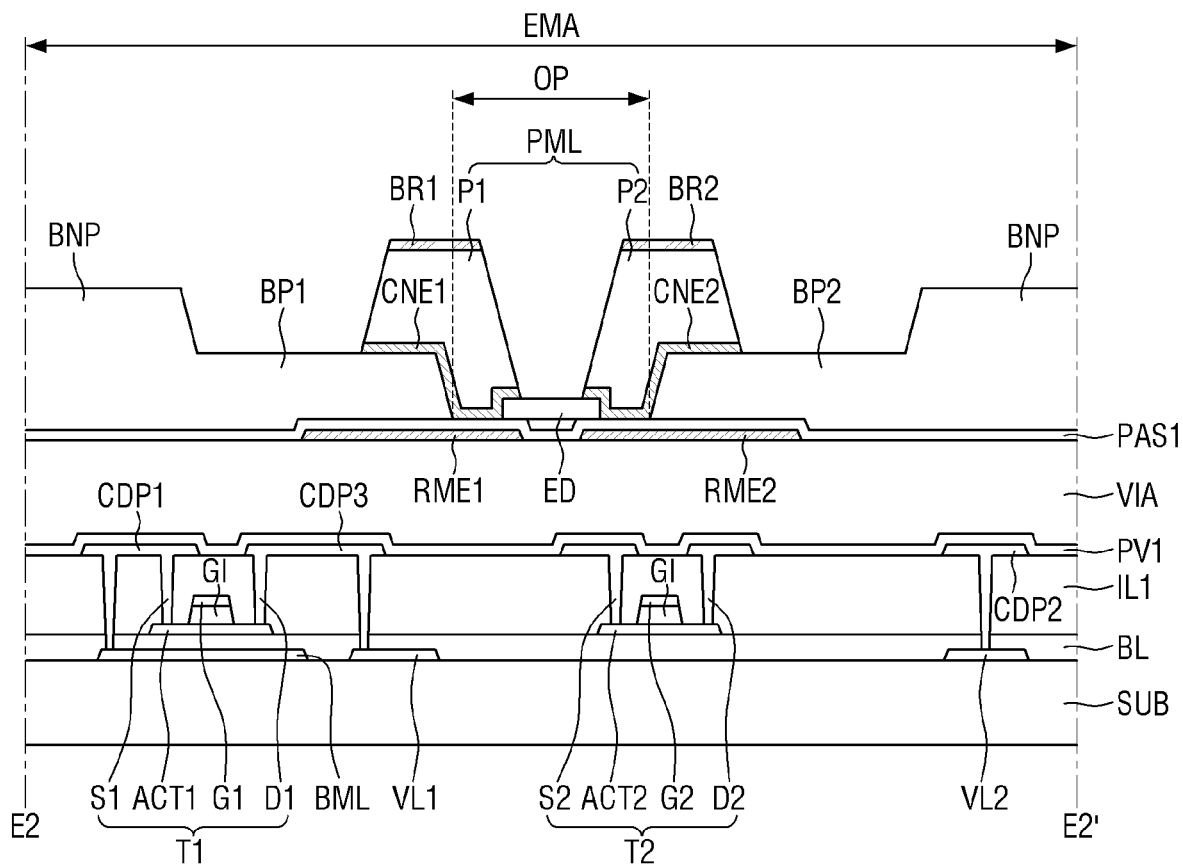
FIG. 6 is a schematic cross-sectional view taken along line E2-E2' of FIG. 2.

FIG. 5 is a schematic cross-sectional view taken along line E1-E1' of FIG. 2. FIG. 6 is a schematic cross-sectional view taken along line E2-E2' of FIG. 2.

FIG. 5 illustrates a cross section that crosses both ends of the light emitting element ED, the electrode contact holes CTD and CTS, and the contact portions CT1 and CT2 disposed in the first sub-pixel SPX1, and FIG. 6 illustrates a cross section that crosses both ends of the light emitting element ED disposed in the first sub-pixel SPX1 and a portion of the bank layer BNL.

Referring to FIGS. 2 to 6, the display device 10 may include a substrate SUB and a semiconductor layer, conductive layers, and insulating layers disposed on the substrate SUB. The display device 10 may include the electrodes RME (RME1 and RME2), the light emitting element ED, the contact electrode layer CNL (CNE1 and CNE2), and the connection electrode layer BRL (BR1 and BR2).

The substrate SUB may be an insulating substrate. The substrate SUB may be made of an insulating material such as glass, quartz, or polymer resin. Further, the substrate SUB may be a rigid substrate, but may also be a flexible substrate which can be bent, folded or rolled. The substrate SUB may include the display area DPA and the non-display area NDA surrounding the display area DPA, and the display area DPA may include the emission area EMA and the sub-region SA that may be a part of the non-emission area.

A first conductive layer may be disposed on the substrate SUB. The first conductive layer may include a lower metal layer BML, the first voltage line VL1, and the second voltage line VL2. The lower metal layer BML may be arranged to overlap an active layer ACT1 of a first transistor T1. The lower metal layer BML may prevent light from being incident on the first active layer ACT1 of the first transistor or may be electrically connected to the first active layer ACT1 to perform a function of stabilizing the electrical characteristics of the first transistor T1. However, the lower metal layer BML may be omitted.

The first voltage line VL1 may be applied with a high potential voltage (or a first power voltage) transmitted to a first electrode RME1, and the second voltage line VL2 may be applied with a low potential voltage (or a second power voltage) transmitted to a second electrode RME2. The first voltage line VL1 may be electrically connected to the first transistor T1 through a conductive pattern (e.g., a third conductive pattern CDP3 of the third conductive layer. The second voltage line VL2 may be electrically connected to the second electrode RME2 through a conductive pattern (e.g., a second conductive pattern CDP2 of the third conductive layer.

Although the drawing illustrates that the first voltage line VL1 and the second voltage line VL2 may be disposed on the first conductive layer, the disclosure is not limited thereto. In some embodiments, the first voltage line VL1 and the second voltage line VL2 may also be disposed on the third conductive layer to be directly electrically connected to the first transistor T1 and the second electrode RME2, respectively.

A buffer layer BL may be disposed on the first conductive layer and the substrate SUB. The buffer layer BL may be formed on the substrate SUB to protect the transistors of the pixel PX from moisture permeating through the substrate SUB susceptible to moisture permeation, and may perform a surface planarization function.

The semiconductor layer may be disposed on the buffer layer BL. The semiconductor layer may include the first active layer ACT1 of the first transistor T1 and a second active layer ACT2 of the second transistor T2. The first active layer ACT1 and the second active layer ACT2 may be disposed to partially overlap a first gate electrode G1 and a second gate electrode G2 of a second conductive layer to be described later, respectively.

The semiconductor layer may include polycrystalline silicon, monocrystalline silicon, oxide semiconductor, and the like, or a combination thereof. In another embodiment, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

Although it is illustrated in the drawing that one first transistor T1 may be disposed in the sub-pixel SPXn of the display device 10, but the disclosure is not limited thereto, and the display device 10 may include a larger number of transistors.

A first gate insulating layer G1 may be disposed on the semiconductor layer in the display area DPA. The first gate insulating layer G1 may serve as a gate insulating layer of each of the transistors T1 and T2. In the drawings, it is illustrated that the first gate insulating layer G1 may be patterned together with the gate electrodes G1 and G2 of the second conductive layer to be described later, and may be partially disposed between the second conductive layer and the active layers ACT1 and ACT2 of the semiconductor layer. However, the disclosure is not limited thereto. In some embodiments, the first gate insulating layer G1 may be entirely disposed on the buffer layer BL.

The second conductive layer may be disposed on the first gate insulating layer G1. The second conductive layer may include a first gate electrode G1 of the first transistor T1 and a second gate electrode G2 of the second transistor T2. The first gate electrode G1 may be disposed to overlap the channel region of the first active layer ACT1 in a third direction DR3 that may be a thickness direction, and the second gate electrode G2 may be disposed to overlap the channel region of the second active layer ACT2 in the third direction DR3 that may be the thickness direction. Although not shown in the drawing, the second conductive layer may further include an electrode of the storage capacitor.

A first interlayer insulating layer IL1 may be disposed on the second conductive layer. The first interlayer insulating layer IL1 may function as an insulating film between the second conductive layer and other layers disposed thereon, and may protect the second conductive layer.

A third conductive layer may be disposed on the first interlayer insulating layer IL1. The third conductive layer may include conductive patterns CDP1, CDP2, and CDP3, and source electrodes S1 and S2 and drain electrodes D1 and D2 of the transistors T1 and T2. A portion of the conductive patterns CDP1, CDP2, and CDP3 may electrically connect conductive layers or semiconductor layers of different layers to each other and serve as source and drain electrodes of the transistors T1 and T2.

The first conductive pattern CDP1 may be in contact with the first active layer ACT1 of the first transistor T1 through the contact hole penetrating the first interlayer insulating layer IL1. The first conductive pattern CDP1 may be in contact with the lower metal layer BML through a contact hole penetrating the first interlayer insulating layer IL1 and the buffer layer BL. The first conductive pattern CDP1 may serve as a first source electrode S1 of the first transistor T1. The first conductive pattern CDP1 may be electrically connected to the first electrode RME1 or the first contact electrode CNE1. The first transistor T1 may transmit the first power voltage applied from the first voltage line VL1 to the first electrode RME1 or the first contact electrode CNE1.

The second conductive pattern CDP2 may be in contact with the second voltage line VL2 through a contact hole penetrating the first interlayer insulating layer IL1 and the buffer layer BL. The second conductive pattern CDP2 may be electrically connected to the first electrode RME1 or the first contact electrode CNE1. The second voltage line VL2 may transmit the second power voltage to the second electrode RME2 or the second contact electrode CNE2.

The third conductive pattern CDP3 may be in contact with the first voltage line VL1 through a contact hole penetrating the first interlayer insulating layer IL1 and the buffer layer BL. Further, the third conductive pattern CDP3 may be in contact with the first active layer ACT1 of the first transistor T1 through the contact hole penetrating the first interlayer insulating layer IL1. The third conductive pattern CDP3 electrically connects the first voltage line VL1 to the first transistor T1 and may serve as the first drain electrode D1 of the first transistor T1.

The second source electrode S2 and the second drain electrode D2 may be in contact with the second active layer ACT2 of the second transistor T2 through the contact holes penetrating the first interlayer insulating layer IL1. The second transistor T2 may transmit a data signal to the first transistor T1 or transmit an initialization signal.

A first passivation layer PV1 may be disposed on the third conductive layer. The first passivation layer PV1 may function as an insulating layer between the third conductive layer and other layers and may protect the third conductive layer.

The buffer layer BL, the first gate insulating layer G1, the first interlayer insulating layer IL1, and the first passivation layer PV1 described above may be formed of inorganic layers stacked on each other in an alternating manner. For example, the buffer layer BL, the first gate insulating layer G1, the first interlayer insulating layer IL1, and the first passivation layer PV1 may be formed as a double layer formed by stacking, or a multilayer formed by alternately stacking, inorganic layers including at least one of silicon oxide ($SiO_x$), silicon nitride ($SiN_x$), and silicon oxynitride ($SiO_xN_y$). However, the disclosure is not limited thereto, and the buffer layer BL, the first gate insulating layer G1, the first interlayer insulating layer IL1, and the first passivation layer PV1 may be formed as a single inorganic layer containing the above-described insulating material. Further, in some embodiments, the first interlayer insulating layer IL1 may be made of an organic insulating material such as polyimide (PI) or the like.

A via layer VIA may be disposed on the third conductive layer in the display area DPA. The via layer VIA may contain an organic insulating material, e.g., polyimide (PI), and may compensate the stepped portion formed by the conductive layers disposed thereunder to flatten the top surface. However, in some embodiments, the via layer VIA may be omitted.

The display device 10 may include, as a display element layer disposed on the via layer VIA, the electrode RME (RME1 and RME2), the bank layer BNL, the light emitting element ED, the contact electrode layer CNL, and the connection electrode layer BRL. In addition, the display device 10 may include a first insulating layer PAS1 and an intermediate layer PML disposed on the via layer VIA.

The electrodes RME may be disposed on the via layer VIA. For example, the electrodes RME may be directly disposed on the via layer VIA and may face and be spaced apart from each other. The first electrode RME1 and the second electrode RME2 may overlap the barrier walls BP1 and BP2 of the bank layer BNL, respectively, which will be described later. The first electrode RME1 may overlap the first barrier wall BP1, and the second electrode RME2 may overlap the second barrier wall BP2. The first electrode RME1 and the second electrode RME2 may be disposed to be spaced apart from each other, and a space between them may overlap the opening OP of the bank layer BNL. In an embodiment, a gap between the first electrode RME1 and the second electrode RME2 spaced apart from each other may be smaller than the width of the opening OP of the bank layer BNL, or a gap between the first barrier wall BP1 and the second barrier wall BP2. The opening OP may have a width sufficient to allow the light emitting element ED to be disposed, and the first electrode RME1 and the second electrode RME2 may be spaced apart with a gap enough to allow both ends of the light emitting element ED to be placed therein.

The electrodes RME may be in direct contact with the third conductive layer through the electrode contact holes CTD and CTS at the portions overlapping the bank layer BNL between the emission area EMA and the sub-region SA. The first electrode contact hole CTD may be formed in an area in which the bank layer BNL and the first electrode RME1 overlap, and the second electrode contact hole CTS may be formed in an area in which the bank layer BNL and the second electrode RME2 overlap. The first electrode RME1 may be in contact with the first conductive pattern CDP1 through the first electrode contact hole CTD penetrating the via layer VIA and the first passivation layer PV1. The second electrode RME2 may be in contact with the second conductive pattern CDP2 through the second electrode contact hole CTS penetrating the via layer VIA and the first passivation layer PV1. The first electrode RME1 may be electrically connected to the first transistor T1 through the first conductive pattern CDP1 and may receive the first power voltage. The second electrode RME2 may be electrically connected to the second voltage line VL2 through the second conductive pattern CDP2 and may receive the second power voltage. However, the disclosure is not limited thereto. In another embodiment, each of the electrodes RME1 and RME2 may not be electrically connected to the conductive patterns CDP1 and CDP2 of the third conductive layer, and the contact electrode layer CNL to be described later may be directly connected to the third conductive layer.

The electrodes RME may include a conductive material having high reflectivity. For example, the electrodes RME may contain a metal such as silver (Ag), copper (Cu), or aluminum (Al), or may contain an alloy including aluminum (Al), nickel (Ni), lanthanum (La), or the like, or may include a combination thereof. Alternatively, the electrodes RME may have a structure in which a metal layer such as titanium (Ti), molybdenum (Mo), and niobium (Nb) and the alloy may be stacked on each other. In some embodiments, the electrodes RME may be formed as a double layer or a multilayer formed by stacking at least one metal layer made of an alloy including aluminum (Al) and titanium (Ti), molybdenum (Mo), and niobium (Nb).

The disclosure is not limited thereto, and each electrode RME may further include a transparent conductive material. For example, each electrode RME may include a material such as ITO, IZO, and ITZO. In some embodiments, each of the electrodes RME may have a structure in which at least one transparent conductive material and at least one metal layer having high reflectivity may be stacked on each other, or may be formed as one layer including them. For example, each electrode RME may have a stacked structure of ITO/Ag/ITO, ITO/Ag/IZO, ITO/Ag/ITZO/IZO, or the like. The electrodes RME may be electrically connected to the light emitting element ED, and may reflect some of the lights emitted from the light emitting element ED in an upward direction of the substrate SUB.

The first insulating layer PAS1 may be disposed in the entire display area DPA and may be disposed on the via layer VIA and the electrodes RME. The first insulating layer PAS1 may be disposed under the light emitting element ED to be described later to cover the electrodes RME. The first insulating layer PAS1 may include an insulating material to protect the electrodes RME and insulate electrodes RME different from each other. The first insulating layer PAS1 may be disposed to cover the electrodes RME before the bank layer BNL may be formed, so that it may be possible to prevent the electrodes RME from being damaged in a process of forming the bank layer BNL. The first insulating layer PAS1 may prevent the light emitting element ED disposed thereon from being damaged by direct contact with other members.

In an embodiment, the first insulating layer PAS1 may have stepped portions such that the top surface thereof may be partially depressed between the electrodes RME spaced apart in the second direction DR2. The light emitting element ED may be disposed on the top surface of the first insulating layer PAS1, where the stepped portions may be formed, and thus a space may remain between the light emitting element ED and the first insulating layer PAS1. The intermediate layer PML may be filled in a space between the light emitting element ED and the first insulating layer PAS1.

According to an embodiment, the first insulating layer PAS1 may include the contact portions CT1 and CT2. The contact portions CT1 and CT2 of the first insulating layer PAS1 may be formed in a portion in which the contact electrode CNE and the electrode RME may be connected in the sub-region SA. The first insulating layer PAS1 may be disposed entirely on the via layer VIA, and the lower layers may be partially exposed in a portion in which the contact portions CT1 and CT2 may be formed.

The contact portions CT1 and CT2 formed in the first insulating layer PAS1 may be disposed to overlap different electrodes RME. For example, the contact portions CT1 and CT2 may include a first contact portion CT1 disposed to overlap the first electrode RME1 and a second contact portion CT2 disposed in the sub-region SA to overlap the second electrode RME2 in the sub-region SA. The first contact portion CT1 and the second contact portion CT2 may penetrate the first insulating layer PAS1 to partially expose the top surface of the first electrode RME1 or the second electrode RME2 thereunder. Each of the first contact portion CT1 and the second contact portion CT2 may further penetrate some of the other insulating layers disposed on the first insulating layer PAS1. The electrode RME exposed by each of the contact portions CT1 and CT2 may be in contact with the contact electrode CNE.

The bank layer BNL may be disposed on the first insulating layer PAS1. The bank layer BNL may include the bank portion BNP, and barrier walls BP1 and BP2 having different heights from the bank portion BNP, each of which may be disposed in the emission area EMA of the sub-pixel SPXn, or the boundary of the sub-pixel SPXn. The barrier walls BP1 and BP2 and the bank portion BNP may be integrated with each other, and they may be referred to as a portion of the bank layer BNL according to a disposition position and height.

The barrier walls BP1 and BP2 of the bank layer BNL may be disposed in the emission area EMA of each sub-pixel SPXn. The barrier walls BP1 and BP2 may have a shape extending in the first direction DR1 and may be spaced apart from each other with the opening OP disposed in the emission area EMA therebetween. For example, the barrier walls BP1 and BP2 may include the first barrier wall BP1 and the second barrier wall BP2 that may be spaced apart from each other in the second direction DR2 with respect to the opening OP. The first barrier wall BP1 may be disposed on the left side with respect to the center of the emission area EMA, which may be a side in the second direction DR2, and the second barrier walls BP2 may be disposed on the right side with respect to the center of the emission area EMA, which may be the other side in the second direction DR2, while being spaced apart from the first barrier wall BP1. The first barrier wall BP1 and the second barrier wall BP2 may be alternately disposed along the second direction DR2 and may be disposed in an island-shaped pattern in the display area DPA. The bank portion BNP may be disposed between the first barrier wall BP1 and the second barrier wall BP2 of different sub-pixels SPXn. The light emitting elements ED may be disposed in the opening OP between the first barrier wall BP1 and the second barrier wall BP2.

The first barrier wall BP1 and the second barrier wall BP2 may extend in the first direction DR1 to be integrated with a portion surrounding the emission area EMA in the bank portion BNP of the bank layer BNL. A length of the barrier walls BP1 and BP2 in the first direction DR1 may be the same as a length of the emission area EMA in the first direction DR1.

The widths of the first barrier wall BP1 and the second barrier wall BP2 in the second direction DR2 may be the same. However, the disclosure is not limited thereto, and they may have different widths. For example, one barrier wall may have a greater width than the other barrier wall. Although it is illustrated in the drawing that two barrier walls BP1 and BP2 having the same width may be arranged for the sub-pixel SPXn, the disclosure is not limited thereto. The number and the shape of the barrier walls BP1 and BP2 may vary depending on the number or the arrangement structure of the electrodes RME.

The barrier walls BP1 and BP2 may be arranged on the first insulating layer PAS1. For example, the barrier walls BP1 and BP2 may be directly disposed on the first insulating layer PAS1, and may have a structure in which at least a portion thereof protrudes with respect to the top surface of the first insulating layer PAS1. The protruding portion of the barrier walls BP1 and BP2 may have an inclined or curved side surface with a certain curvature. Unlike the example illustrated in the drawing, the barrier walls BP1 and BP2 may have a shape, e.g., a semicircular or semi-elliptical shape, in which the outer surface may be curved with a certain curvature in cross-sectional view.

The bank portion BNP of the bank layer BNL may be disposed on the first insulating layer PAS1. The bank portion BNP may include portions extending in the first direction DR1 and the second direction DR2, and may surround the sub-pixels SPXn. The bank portion BNP may surround and divide the emission area EMA and the sub-region SA of each sub-pixel SPXn, and may be integrated with the barrier walls BP1 and BP2 disposed in the emission area EMA. The bank portion BNP of the bank layer BNL may surround the outermost portion of the display area DPA and may divide the display area DPA from the non-display area NDA. The bank layer BNL may be disposed in the entire display area DPA to form a grid pattern, and the regions exposed by the bank layer BNL in the display area DPA may be the opening OP disposed in the emission area EMA and the sub-region SA. A portion of the bank layer BNL in which the barrier walls BP1 and BP2 may be disposed may be the emission area EMA.

The bank portion BNP of the bank layer BNL may have a thickness greater than that of the barrier walls BP1 and BP2. The height of the top surface of the bank portion BNP may be higher than the height of the top surface of the barrier walls BP1 and BP2. The bank portion BNP may prevent ink from overflowing to the adjacent sub-pixel SPXn in an inkjet printing step during the manufacturing process of the display device 10. The bank layer BNL may include an organic insulating material such as polyimide (PI), but is not limited thereto.

The light emitting elements ED may be arranged in the emission area EMA. The light emitting elements ED may be disposed between the barrier walls BP1 and BP2, and both ends of the light emitting elements ED may be disposed on different electrodes RME, respectively. For example, the light emitting element ED may be disposed such that the first end may be disposed on the first electrode RME1 and the second end may be disposed on the second electrode RME2. The length of the light emitting element ED may be longer than a gap between the electrodes RME spaced apart in the second direction DR2 and may be smaller than a width of the opening OP of the bank layer BNL.

The light emitting elements ED may be directly disposed on the first insulating layer PAS1. The light emitting element ED may be disposed so that one extension direction may be parallel to the top surface of the substrate SUB. As will be described later, the light emitting element ED may include semiconductor layers arranged along a direction in which the light emitting element ED extends, and the semiconductor layers may be sequentially arranged along the direction parallel to the top surface of the substrate SUB. However, the disclosure is not limited thereto, and the semiconductor layers may be arranged in the direction perpendicular to the substrate SUB in case that the light emitting element ED has another structure.

The light emitting elements ED disposed in each sub-pixel SPXn may emit light of different wavelength bands depending on a material constituting the semiconductor layer. However, the disclosure is not limited thereto, and the light emitting elements ED arranged in each sub-pixel SPXn may include the semiconductor layer of the same material and emit light of the same color.

The light emitting elements ED may be electrically connected to the electrode RME and the conductive layers below the via layer VIA while being in contact with the contact electrodes CNE (CNE1 and CNE2), and may emit light of a specific wavelength band by receiving an electrical signal.

The contact electrode layer CNL may be disposed on the light emitting element ED and the bank layer BNL. The contact electrode layer CNL may be directly disposed on the light emitting element ED, may be electrically connected to the light emitting element ED, and may fix the light emitting elements ED.

In the contact electrodes CNE1 and CNE2 of the contact electrode layer CNL, the contact electrode CNE may include the first contact electrode CNE1 and the second contact electrode CNE2 disposed in each sub-pixel SPXn. The first contact electrode CNE1 may be disposed on the first electrode RME1 and the first barrier wall BP1. The second contact electrode CNE2 may be disposed on the second electrode RME2 and the second barrier wall BP2.

The first contact electrode CNE1 may be directly disposed on the first barrier wall BP1 in the emission area EMA and may be in contact with the first end of the light emitting element ED. The first contact electrode CNE1 may be disposed even in the sub-region SA beyond the bank portion BNP of the bank layer BNL in the emission area EMA. The first contact electrode CNE1 may be in contact with the first electrode RME1 in the sub-region SA through the first contact portion CT1 penetrating the first insulating layer PAS1.

The second contact electrode CNE2 may be directly disposed on the second barrier wall BP2 in the emission area EMA and may be in contact with the second end of the light emitting element ED. The second contact electrode CNE2 may be disposed even in the sub-region SA beyond the bank portion BNP of the bank layer BNL in the emission area EMA. The second contact electrode CNE2 may be in contact with the second electrode RME2 in the sub-region SA through the second contact portion CT2 penetrating the first insulating layer PAS1.

The first contact electrode CNE1 and the second contact electrode CNE2 may be spaced apart from each other by a gap sufficient to contact both ends of the light emitting element ED, respectively. In an embodiment, a gap between the first contact electrode CNE1 and the second contact electrode CNE2 may be smaller than the length of the light emitting element ED. In addition, a gap between the first contact electrode CNE1 and the second contact electrode CNE2 may be smaller than a width of the opening OP of the bank layer BNL.

The first contact electrode CNE1 may be electrically connected to the first transistor T1, so that the first power voltage may be applied to the first contact electrode CNE1, and the second contact electrode CNE2 may be electrically connected to the second voltage line VL2, so that the second power voltage may be applied to the second contact electrode CNE2. Each contact electrode CNE may be in contact with the light emitting element ED in the emission area EMA to transmit the power voltage to the light emitting element ED.

However, the disclosure is not limited thereto. In some embodiments, the contact electrodes CNE may be in direct contact with the third conductive layer, and may be electrically connected to the third conductive layer through patterns other than the electrodes RME.

The intermediate layer PML may be disposed on the contact electrode layer CNL. The intermediate layer PML may be interposed between the connection electrode layer BRL and the contact electrode layer CNL disposed thereon so that they may not be directly in contact with each other. However, in case that the repair process of the display device 10 is performed, the connection electrode layer BRL may penetrate the intermediate layer PML to be in contact with the contact electrode layer CNL.

In an embodiment, the intermediate layer PML may have the same pattern shape as the contact electrode layer CNL. The intermediate layer PML may include the first pattern portion P1 disposed on the first contact electrode CNE1 and the second pattern portion P2 disposed on the second contact electrode CNE2. The first pattern portion P1 may overlap the first electrode RME1, the first barrier wall BP1, and the first contact electrode CNE1, and the second pattern portion P2 may overlap the second electrode RME2, the second barrier wall BP2, and the second contact electrode CNE2. The first pattern portion P1 and the second pattern portion P2 may overlap the barrier walls BP1 and BP2 of the bank layer BNL in the emission area EMA, and may be disposed even in the sub-region SA beyond the bank portion BNP.

In the intermediate layer PML, the first pattern portion P1 and the second pattern portion P2 may be spaced apart from each other, and a minimum gap among the gaps therebetween may be the same as a gap between the contact electrodes CNE1 and CNE2 spaced apart from each other. A gap between the first pattern portion P1 and the second pattern portion P2 may be smaller than a width of the opening OP of the bank layer BNL.

Each of the first insulating layer PAS1 and the intermediate layer PML described above may include an inorganic insulating material or an organic insulating material. For example, each of the first insulating layer PAS1 and the intermediate layer PML may include an inorganic insulating material, or the first insulating layer PAS1 may include an inorganic insulating material and the intermediate layer PML may include an organic insulating material. Each or at least one of the first insulating layer PAS1 and the intermediate layer PML may also be formed in a structure in which insulating layers may be alternately or repeatedly stacked on each other. In an embodiment, each of the first insulating layer PAS1 and the intermediate layer PML may be any one of silicon oxide ($SiO_x$), silicon nitride ($SiN_x$), and silicon oxynitride ($SiO_xN_y$). The first insulating layer PAS1 and the intermediate layer PML may be made of the same material, portions of them may be the same and other portions may be made of different materials, or each may be made of different materials.

According to an embodiment, the intermediate layer PML may include an inorganic insulating material or an organic insulating material which may be transparent. Light emitted from the light emitting element ED may be emitted through a space between the pattern portions P1 and P2 of the intermediate layer PML, but some may also be incident on the intermediate layer PML. Even so, the intermediate layer PML may be formed of a transparent material so that most of the light emitted from the light emitting element ED may be emitted. As illustrated in FIGS. 5 and 6, in an embodiment in which the intermediate layer PML includes an organic insulating material, the intermediate layer PML may be formed to have a flat top surface irrespective of the height difference between the lower bank layer BNL and the contact electrode layer CNL. However, the disclosure is not limited thereto. In an embodiment in which the intermediate layer PML includes an inorganic insulating material, the intermediate layer PML may also be disposed in a shape according to a lower stepped portion.

The connection electrode layer BRL may be disposed on the intermediate layer PML. The connection electrode layer BRL may be spaced apart from and electrically insulated from the contact electrode layer CNL with the intermediate layer PML interposed therebetween. However, in case that the repair process of the display device 10 is performed, the connection electrode layer BRL may penetrate the intermediate layer PML to be in contact with the contact electrode layer CNL.

In an embodiment, the connection electrode layer BRL may have the same pattern shape as the intermediate layer PML and the contact electrode layer CNL. The connection electrode layer BRL may include the first connection electrode BR1 disposed on the first pattern portion P1 of the intermediate layer PML and the second connection electrode BR2 disposed on the second pattern portion P2. The first connection electrode BR1 may overlap the first electrode RME1, the first barrier wall BP1, and the first contact electrode CNE1, and the second connection electrode BR2 may overlap the second electrode RME2, the second barrier wall BP2, and the second contact electrode CNE2. The first connection electrode BR1 and the second connection electrode BR2 may overlap the barrier walls BP1 and BP2 of the bank layer BNL in the emission area EMA, and may be disposed even in the sub-region SA beyond the bank portion BNP.

In the connection electrode layer BRL, the first connection electrode BR1 and the second connection electrode BR2 may be spaced apart from each other, and a gap therebetween may be the same as a gap between the first pattern portion P1 and the second pattern portion P2 of the intermediate layer PML spaced apart from each other. A gap between the first connection electrode BR1 and the second connection electrode BR2 may be smaller than a width of the opening OP of the bank layer BNL.

The contact electrode layer CNL and the connection electrode layers BRL may include a conductive material. For example, they may include ITO, IZO, ITZO, aluminum (Al), or the like, or a combination thereof. For example, the contact electrode layer CNL and the connection electrode layer BRL may include a transparent conductive material, and the light emitted from the light emitting element ED may pass through the contact electrode layer CNL, the intermediate layer PML, and the connection electrode layer BRL to be emitted.

As will be described later, the contact electrode layer CNL and the intermediate layer PML may be formed by a patterning process using the connection electrodes BR1 and BR2 of the connection electrode layer BRL as a mask in the fabricating process of the display device 10. The shape of the contact electrodes CNE1 and CNE2 of the contact electrode layer CNL and the pattern portions P1 and P2 of the intermediate layer PML may correspond to the shapes of the connection electrodes BR1 and BR2 disposed thereon in plan view. As the intermediate layer PML and the contact electrode layer CNL may be formed by the patterning process using the connection electrodes BR1 and BR2 as a mask, each of the contact electrodes CNE1 and CNE2, the pattern portions P1 and P2, and the connection electrode BR1, BR2 may have outer side edges parallel to each other.

For example, a side edge in which the first contact electrode CNE1 and the second contact electrode CNE2 face each other may be parallel to a side edge in which the first pattern portion P1 and the second pattern portion P2 face each other. In addition, a side edge in which the first pattern portion P1 and the second pattern portion P2 face each other may be parallel to a side edge in which the first connection electrode BR1 and the second connection electrode BR2 face each other. In addition, an outer side edge opposite to the side edge in which the first contact electrode CNE1 and the second contact electrode CNE2 face each other may be parallel to an outer side edge opposite to the side edge in which the first pattern portion P1 and the second pattern portion P2 face each other. The outer side edge opposite to the side edge in which the first pattern portion P1 and the second pattern portion P2 face each other may be parallel to an outer side edge opposite to the side edge in which the first connection electrode BR1 and the second connection electrode BR2 face each other.

In the drawings, it is disclosed that the side edge of each of the layers may be formed to be inclined, and accordingly, the side edge of each of the layers may be formed to be parallel with the same inclination. The gap between the first contact electrode CNE1 and the second contact electrode CNE2 may be less than or equal to the gap between the first pattern portion P1 and the second pattern portion P2, and the gap between the first pattern portion P1 and the second pattern portion P2 may be less than or equal to the gap between the first connection electrode BR1 and the second connection electrode BR2. In case that the side edges are formed vertically according to the patterning process, the side edges of each of the layers may be completely vertically parallel to each other, and the gaps among the contact electrodes CNE1 and CNE2, the pattern portions P1 and P2, and the connection electrodes BR1 and BR2 may be equal to each other.

According to an embodiment, the contact electrodes CNE of the contact electrode layer CNL and the connection electrodes BR1 and BR2 of the connection electrode layer BRL may include different materials. Since the intermediate layer PML may be disposed between the contact electrode layer CNL and the connection electrode layer BRL, in an embodiment in which the intermediate layer PML includes an organic insulating material, the deformation of the conductive material may also occur in forming the intermediate layer PML. Accordingly, in the process of forming the organic insulating material, a material that may be subject to deformation may be used for the connection electrode layer BRL disposed on the intermediate layer PML, and a material that may not be subject to deformation may be used for the contact electrode layer CNL disposed under the intermediate layer PML. For example, the contact electrodes CNE1 and CNE2 of the contact electrode layer CNL may include IZO that may be resistant to the drying process of the organic insulating material, and the connection electrodes BR1 and BR2 of the connection electrode layer BRL may include ITO that has relatively weak resistance. In the fabricating process of the display device 10, before the drying process of the intermediate layer PML including the organic insulating material, the connection electrode layer BRL including ITO may be first patterned, and then the drying process of the intermediate layer PML and the patterning process of the intermediate layer PML and the contact electrode layer CNL may be performed. However, the disclosure is not limited thereto, and materials of the contact electrode layer CNL and the connection electrode layer BRL may be selected according to process conditions.

The contact electrodes CNE1 and CNE2 of the contact electrode layer CNL in direct contact with the light emitting element ED may form an electrical connection path between the electrode RME and the light emitting element ED. The display device 10 may further include the intermediate layer PML and a connection electrode layer BRL disposed on the contact electrode layer CNL, and may form an electrical connection path by connecting the connection electrode layer BRL and the contact electrode layer CNL through a repair process in case that the contact electrodes CNE1 and CNE2 of the contact electrode layer CNL are partially disconnected.

Figure 7:
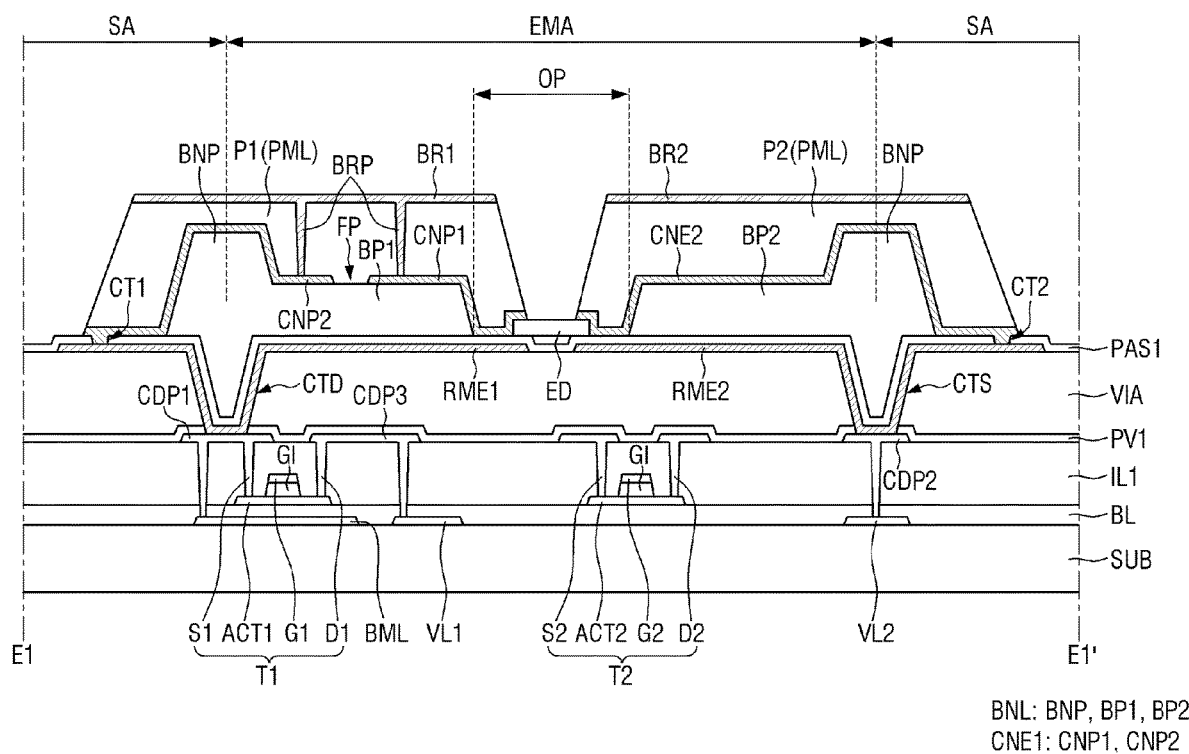
FIG. 7 is a schematic cross-sectional view of a portion on which a repair process of a display device according to an embodiment may be performed.

FIG. 7 is a schematic cross-sectional view of a portion on which a repair process of a display device according to an embodiment may be performed.

Referring to FIG. 7, in the display device 10, in case that a portion of the contact electrode CNE is disconnected and the connection is cut, the light emitting elements ED of the corresponding sub-pixel SPXn may cause light emission failure. As illustrated in the figure, in case that a portion of the first contact electrode CNE1 is disconnected (a 'FP' portion in FIG. 7) and is divided into a first contact portion CNP1 and a second contact portion CNP2, the first contact portion CNP1 may be in contact with the light emitting element ED, and the second contact portion CNP2 may remain in contact with the first electrode RME1. In case that the two contact portions CNP1 and CNP2 are in a disconnected state, one end of the light emitting element ED may not be electrically connected to the first electrode RME1 and thus may not emit light, but in case that the first connection electrode BR1 is connected to the first contact portion CNP1 and the second contact portion CNP2, the light emitting element ED may be electrically connected to the first electrode RME1.

In case that the contact electrodes CNE1 and CNE2 of the contact electrode layer CNL has a disconnection defect, a repair process of connecting the connection electrodes BR1 and BR2 of the connection electrode layer BRL to the contact portions CNP1 and CNP2 of the contact electrodes CNE1 and CNE2 may be performed. The repair process may be a process of connecting the connection electrodes BR1 and BR2 to the contact portions CNP1 and CNP2 that may be cut off from each other, respectively, and may be performed through a laser irradiation process. In case that a contact hole is formed in the intermediate layer PML through a laser irradiation process, the connection electrodes BR1 and BR2 may be connected to the contact portions CNP1 and CNP2 of the contact electrodes CNE1 and CNE2, respectively, through the contact hole. The contact portions CNP1 and CNP2 may be connected to the connection electrodes BR1 and BR2 through the electrode connection portion BRP disposed in the contact hole of the intermediate layer PML, and the connection electrodes BR1 and BR2 may form an electrical connection path.

The display device 10 according to an embodiment may include the intermediate layer PML and the connection electrode layer BRL disposed on the contact electrode layer CNL in preparation for a repair process due to disconnection of the contact electrode layer CNL. Since the repair process of repairing the disconnection of the contact electrode layer CNL may be performed as a process of connecting the previously formed connection electrode layer BRL and the contact electrode layer CNL, there may be an advantage in that the process may be simplified.

Figure 8:
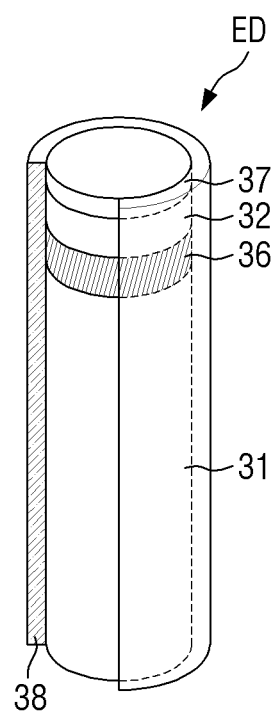
FIG. 8 is a schematic view of a light emitting element according to an embodiment.

FIG. 8 is a schematic view of a light emitting element according to an embodiment. Referring to FIG. 8, the light emitting element ED may be a light emitting diode. Specifically, the light emitting element ED may be an inorganic light emitting diode that has a nanometer or micrometer size, and may be made of an inorganic material. The light emitting element ED may be aligned between two electrodes having polarity in case that an electric field is formed in a specific direction between two electrodes facing each other.

The light emitting element ED according to an embodiment may have a shape elongated in a direction. The light emitting element ED may have a shape of a cylinder, a rod, a wire, a tube, or the like. However, the shape of the light emitting element ED is not limited thereto, and the light emitting element ED may have a polygonal prism shape such as a regular cube, a rectangular parallelepiped and a hexagonal prism, or may have various shapes such as a shape elongated in a direction and having an outer surface partially inclined.

The light emitting element ED may include a semiconductor layer doped with any conductivity type (e.g., p-type or n-type) dopant. The semiconductor layer may emit light of a specific wavelength band by receiving an electrical signal applied from an external power source. The light emitting element ED may include a first semiconductor layer 31, a second semiconductor layer 32, a light emitting layer 36, an electrode layer 37 and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be any one or more of AlGaInN, GaN, AlGaN, InGaN, AlN and InN doped with an n-type dopant. The n-type dopant doped into the first semiconductor layer 31 may be Si, Ge, Sn, or the like, or a combination thereof.

The second semiconductor layer 32 may be disposed on the first semiconductor layer 31 with the light emitting layer 36 therebetween. The second semiconductor layer 32 may be a p-type semiconductor, and the second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be any one or more of AlGaInN, GaN, AlGaN, InGaN, AlN and InN doped with a p-type dopant. The p-type dopant doped into the second semiconductor layer 32 may be Mg, Zn, Ca, Ba, or the like, or a combination thereof. Although it is illustrated in the drawing that the first semiconductor layer 31 and the second semiconductor layer 32 may be configured as one layer, the disclosure is not limited thereto. Depending on the material of the light emitting layer 36, the first semiconductor layer 31 and the second semiconductor layer 32 may further include a larger number of layers, such as a cladding layer or a tensile strain barrier reducing (TSBR) layer. For example, the light emitting element ED may further include another semiconductor layer disposed between the first semiconductor layer 31 and the light emitting layer 36 or between the second semiconductor layer 32 and the light emitting layer 36. A semiconductor layer disposed between the first semiconductor layer 31 and the light emitting layer 36 may be any one or more of AlGaInN, GaN, AlGaN, InGaN, AlN, InN and SLs doped with an n-type dopant, and a semiconductor layer disposed between the second semiconductor layer 32 and the light emitting layer 36 may be any one or more of AlGaInN, GaN, AlGaN, InGaN, AlN, and InN doped with a p-type dopant.

The light emitting layer 36 may be disposed between the first semiconductor layer 31 and the second semiconductor layer 32. The light emitting layer 36 may include a material having a single or multiple quantum well structure. In case that the light emitting layer 36 includes a material having a multiple quantum well structure, quantum layers and well layers may be stacked alternately. The light emitting layer 36 may emit light by coupling of electron-hole pairs according to an electrical signal applied through the first semiconductor layer 31 and the second semiconductor layer 32. The light emitting layer 36 may include a material such as AlGaN, AlGaInN, or InGaN, or a combination thereof. In particular, in case that the light emitting layer 36 has a multiple quantum well structure in which quantum layers and well layers may be alternately stacked, the quantum layer may include a material such as AlGaN or AlGaInN, and the well layer may include a material such as GaN or AlInN.

The light emitting layer 36 may have a structure in which semiconductor materials having large band gap energy and semiconductor materials having small band gap energy may be alternately stacked, and may include other group III to V semiconductor materials according to the wavelength band of the emitted light. The light emitted by the light emitting layer 36 is not limited to the light of the blue wavelength band, but the light emitting layer 36 may also emit light of a red or green wavelength band in some cases.

The electrode layer 37 may be an ohmic connection electrode. However, the disclosure is not limited thereto, and it may be a Schottky connection electrode. The light emitting element ED may include at least one electrode layer 37. The light emitting element ED may include one or more electrode layers 37, but the disclosure is not limited thereto, and the electrode layer 37 may be omitted.

In the display device 10, in case that the light emitting element ED is electrically connected to an electrode or a connection electrode, the electrode layer 37 may reduce the resistance between the light emitting element ED and the electrode or connection electrode. The electrode layer 37 may include a conductive metal. For example, the electrode layer 37 may include at least one of aluminum (Al), titanium (Ti), indium (In), gold (Au), silver (Ag), ITO, IZO, and ITZO.

The insulating film 38 may be arranged to surround the outer surfaces of the semiconductor layers and electrode layers described above. For example, the insulating film 38 may be disposed to surround at least the outer surface of the light emitting layer 36, and may be formed to expose both ends of the light emitting element ED in the longitudinal direction. Further, in cross-sectional view, the insulating film 38 may have a top surface, which may be rounded in a region adjacent to at least one end of the light emitting element ED.

The insulating film 38 may include at least one material having insulating properties, for example, silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). It is illustrated in the drawing that the insulating film 38 may be formed as a single layer, but the disclosure is not limited thereto. In some embodiments, the insulating film 38 may be formed in a multilayer structure having layers stacked on each other therein.

The insulating film 38 may perform a function of protecting the semiconductor layers and the electrode layer of the light emitting element ED. The insulating film 38 may prevent an electrical short circuit that may be likely to occur at the light emitting layer 36 in case that an electrode to which an electrical signal is transmitted is in direct contact with the light emitting element ED. In addition, the insulating film 38 may prevent a decrease in luminous efficiency of the light emitting element ED.

Further, the insulating film 38 may have an outer surface which may be surface-treated. The light emitting elements ED may be aligned in such a way of spraying the ink in which the light emitting elements ED may be dispersed on the electrodes. Here, the surface of the insulating film 38 may be treated to have a hydrophobic property or hydrophilic property in order to keep the light emitting elements ED in the dispersed state without being aggregated with other adjacent light emitting elements ED in the ink.

Hereinafter, a manufacturing process of the display device 10 will be described with reference to other drawings.

FIGS. 9 to 14 are schematic cross-sectional views sequentially illustrating a fabricating process of a display device according to an embodiment.

Figure 9:
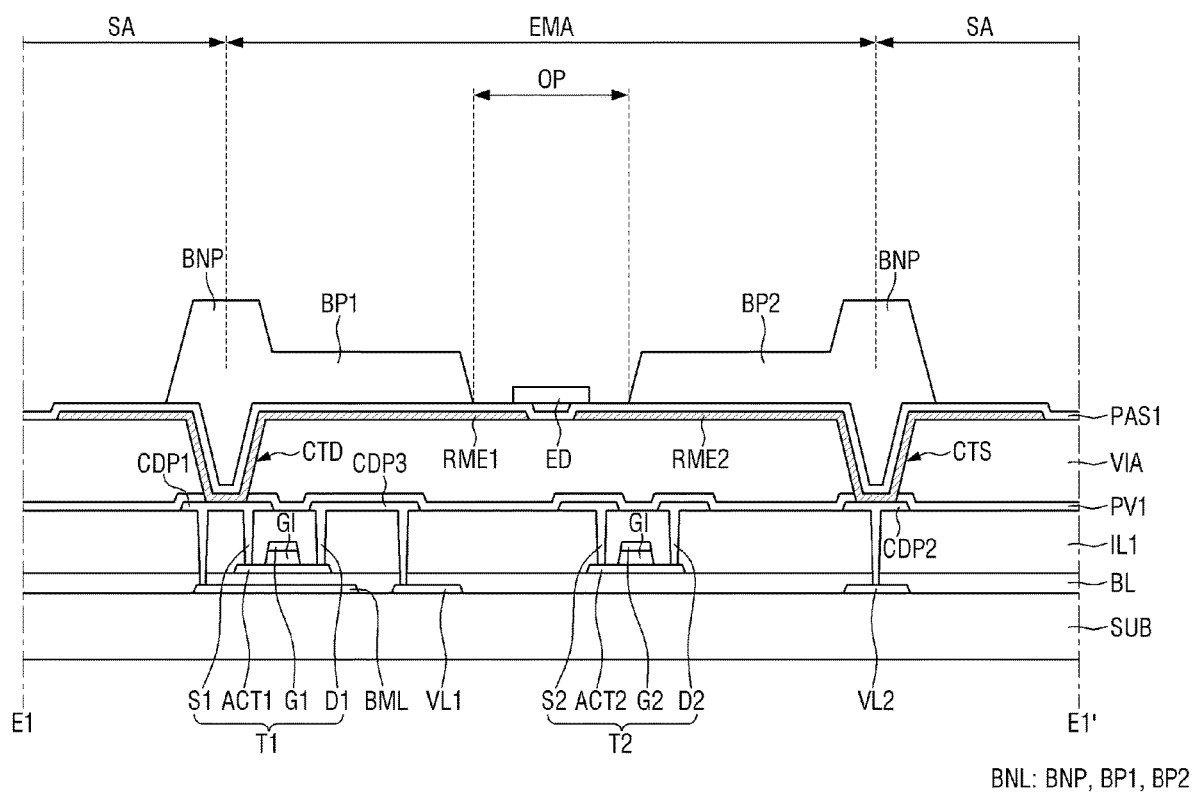
FIGS. 9 to 14 are schematic cross-sectional views sequentially illustrating a fabricating process of a display device according to an embodiment.

Referring to FIG. 9, the substrate SUB may be prepared, the buffer layer BL, a semiconductor layer, first to third conductive layers, the interlayer insulating layer IL1, the first passivation layer PV1, the via layer VIA, the electrodes RME1 and RME2, the first insulating layer PAS1, and the bank layer BNL may be formed on the substrate SUB, and the light emitting elements ED may be disposed in the opening OP of the bank layer BNL.

The first to third conductive layers and the electrodes RME disposed on the substrate SUB may be formed by depositing a material, e.g., a metal material, of each of the layers, and performing a patterning process using a mask. In addition, the buffer layer BL, the first gate insulating layer G1, the first interlayer insulating layer IL1, the via layer VIA, the first insulating layer PAS1, and the bank layer BNL that may be disposed on the substrate SUB may be formed by applying a material constituting each layer, for example, an insulating material, or, if necessary, through a patterning process using a mask. The bank layer BNL may be formed by a patterning process using a half tone mask, and may include the barrier walls BP1 and BP2 having different heights and the bank portion BNP. A description of the structure of the layers disposed on the substrate SUB may be the same as described above, and thus a detailed description thereof will be omitted.

In an embodiment, the light emitting elements ED may be disposed on the electrode RME by an inkjet printing process. In case that an electrical signal is applied to the electrodes RME after an ink in which the light emitting elements ED may be dispersed is sprayed into the area surrounded by the bank layer BNL, the light emitting elements ED in the ink may be placed on the electrodes RME while changing their own positions and orientation directions. The light emitting elements ED may be aligned by an electric field generated by an electrical signal applied to the electrode RME in the opening OP of the bank layer BNL. The light emitting element ED may be disposed so that the first end at which the second semiconductor layer 32 may be positioned may be placed on the first electrode RME1, and the second end at which the first semiconductor layer 31 may be positioned may be placed on the second electrode RME2.

Figure 10:
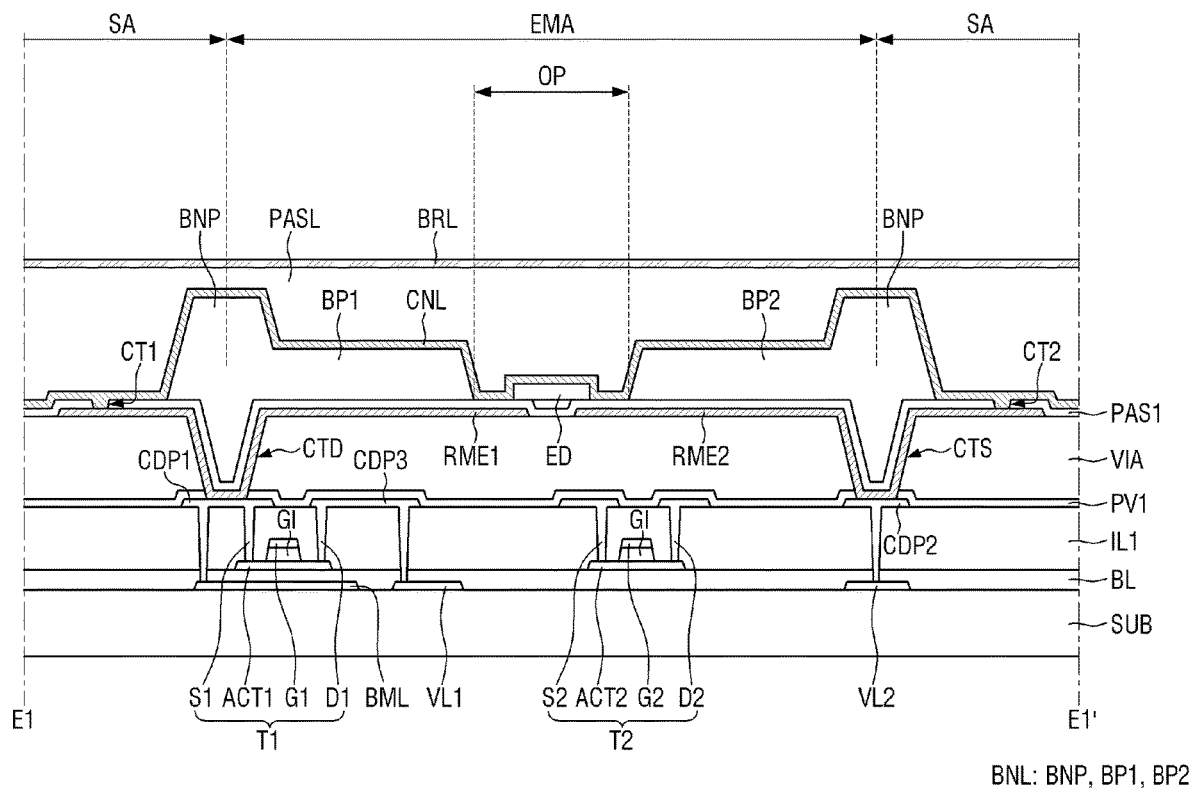

Referring to FIG. 10, a contact electrode material layer CNL, an insulating material layer PASL, and a connection electrode material layer BRL may be sequentially formed on the light emitting element ED and the bank layer BNL. Each of the contact electrode material layer CNL, the insulating material layer PASL, and the connection electrode material layer BRL may be formed through a process of depositing a material forming them. The contact electrode material layer CNL may be disposed to cover the light emitting element ED, the bank layer BNL, and the first insulating layer PAS1, and may fix the light emitting element ED on the first insulating layer PAS1. The contact electrode material layer CNL may be directly in contact with the light emitting element ED within the opening OP and may be directly in contact with the bank layer BNL and the first insulating layer PAS1.

The insulating material layer PASL may be disposed directly on the contact electrode material layer CNL, and the connection electrode material layer BRL may be disposed directly on the insulating material layer PASL. Each of the contact electrode material layer CNL, the insulating material layer PASL, and the connection electrode material layer BRL may be patterned in a subsequent process to form the contact electrodes CNE1 and CNE2, the intermediate layer PML, and the connection electrodes BR1 and BR2. In the drawings, it is disclosed that the insulating material layer PASL includes an organic insulating material to be formed with a flat top surface. However, the disclosure is not limited thereto, and in case that the insulating material layer PASL includes an inorganic insulating material, the top surface may not be formed flat but may have a shape corresponding to the lower stepped portion.

Figure 11:
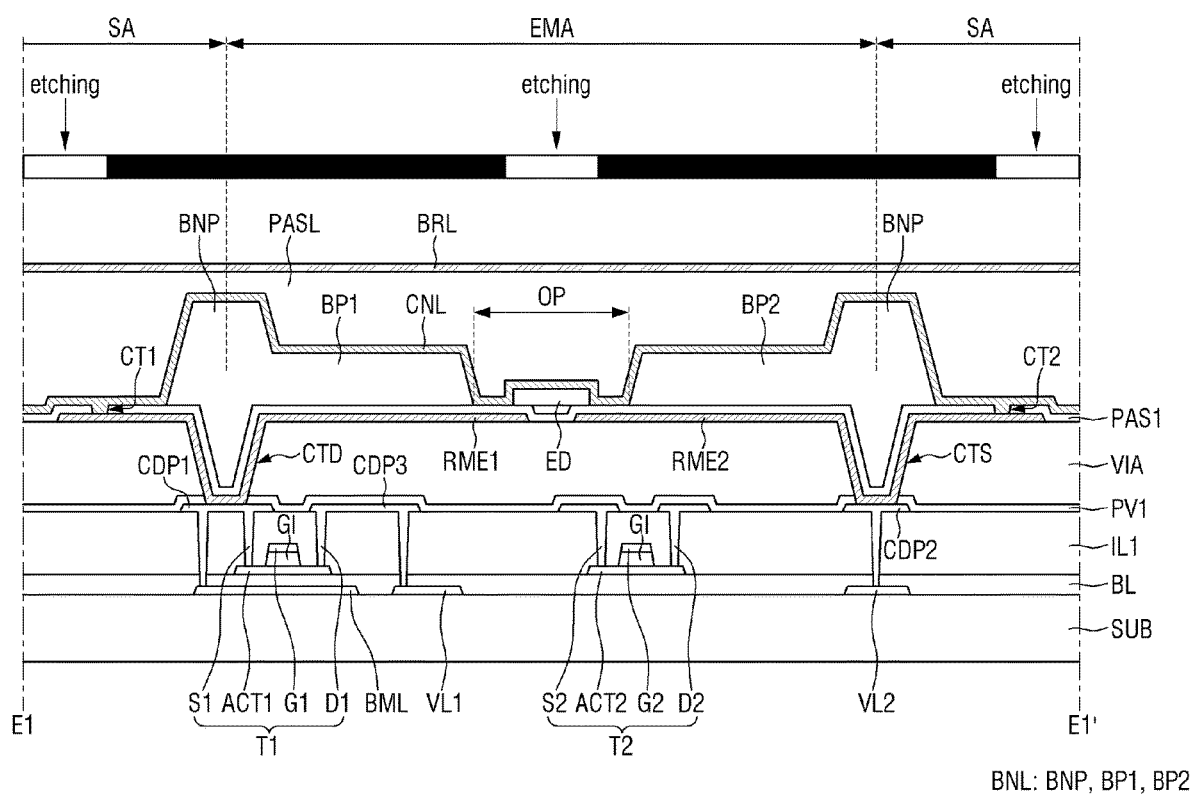
Figure 12:
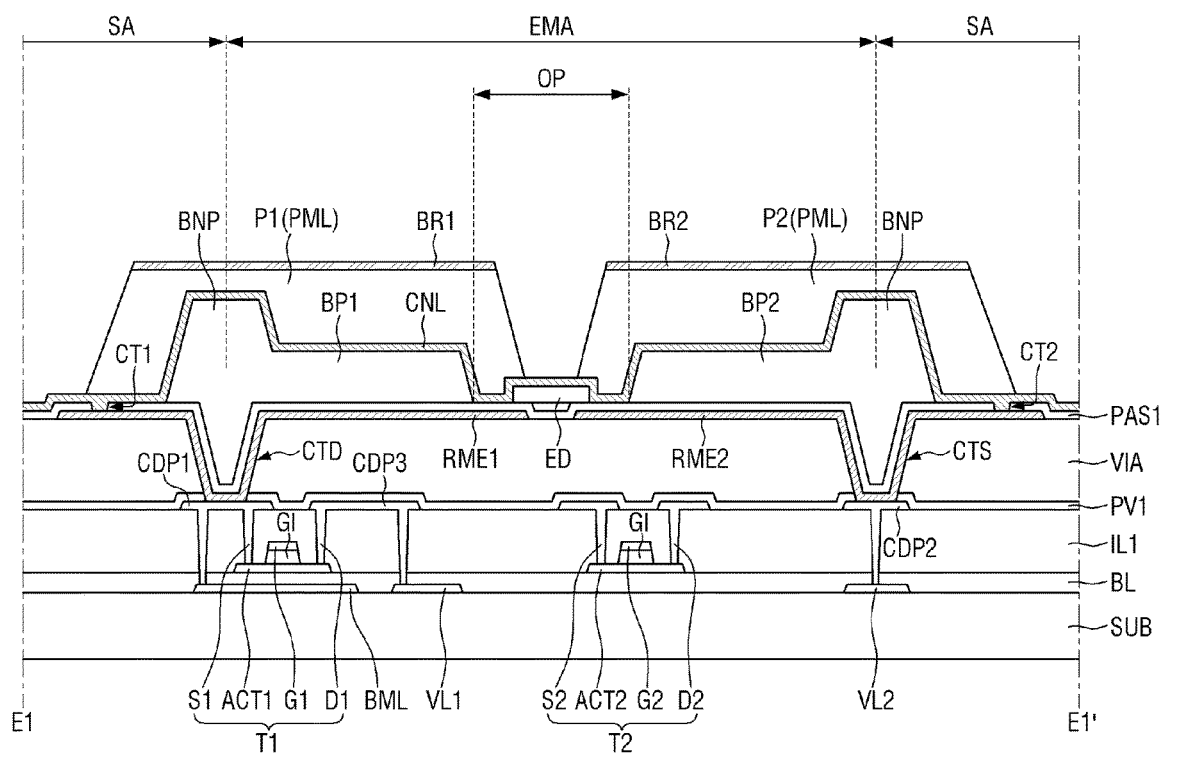

Referring to FIGS. 11 and 12, the connection electrode material layer BRL and the insulating material layer PASL may be patterned to form the connection electrodes BR1 and BR2 and the intermediate layer PML. A mask may be disposed on the connection electrode material layer BRL to remove a portion of the connection electrode material layer BRL and the insulating material layer PASL. A portion of the connection electrode material layer BRL overlapping the light emitting element ED or the opening OP and a portion thereof not overlapping the bank layer BNL may be partially removed. The insulating material layer PASL may be patterned to have the same shape in plan view as the connection electrode material layer BRL. In the patterning process, the connection electrode material layer BRL and the insulating material layer PASL may form the connection electrodes BR1 and BR2 of the connection electrode layer BRL and the intermediate layer PML, respectively, and their planar disposition may have the pattern shape illustrated in FIG. 3 and FIG. 4. The connection electrodes BR1 and BR2 and the intermediate layer PML may be disposed over the emission area EMA and the sub-region SA, and each of them according to a position may be divided into the first connection electrode BR1 and the second connection electrode BR2 or the first pattern portion P1 and the second pattern portion P2. The connection electrode material layer BRL and the insulating material layer PASL may be etched simultaneously in one etch process, or may also be etched separately in different etch processes depending on the material of each layer.

Figure 13:
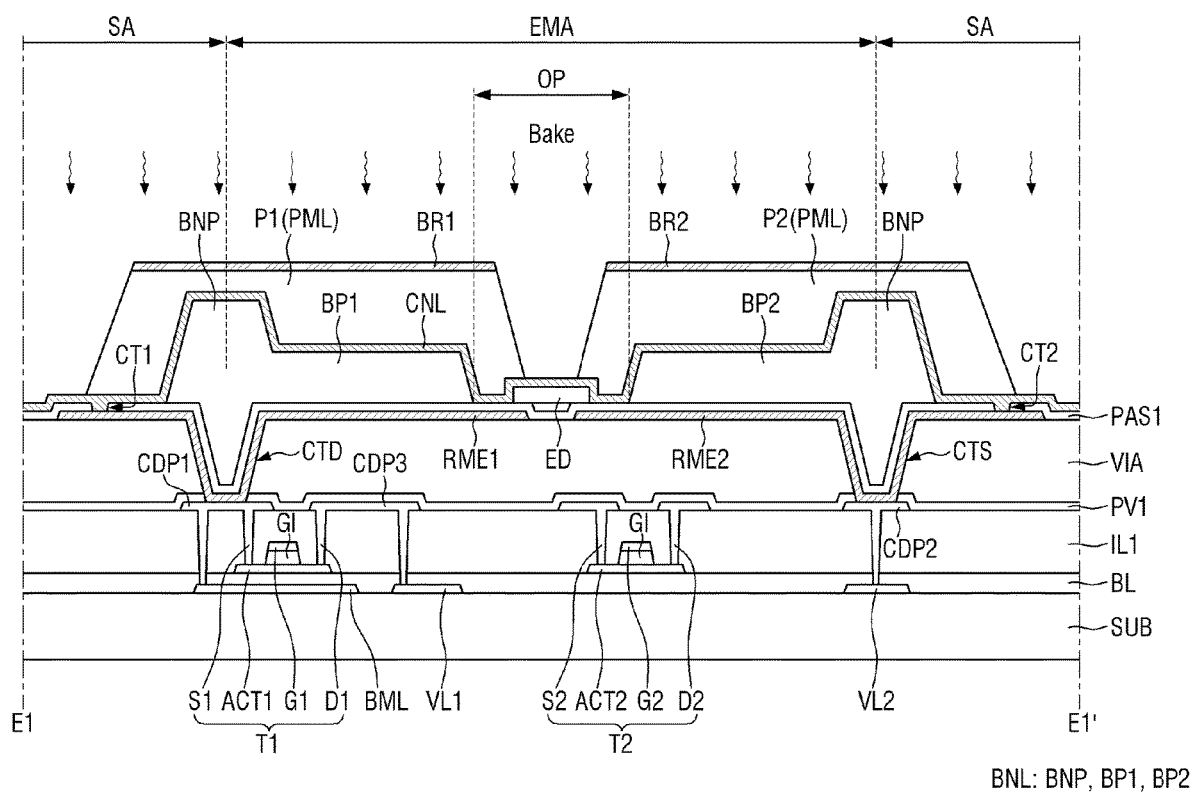

Then, referring to FIG. 13, a drying process (bake) of the intermediate layer PML may be performed. As described above, in an embodiment in which the intermediate layer PML includes an organic insulating material, the deformation of the connection electrodes BR1 and BR2 and the contact electrode material layer CNL may occur during the drying process (bake) of the intermediate layer PML. In case that deformation occurs in the corresponding layer, the patterning process may not be smoothly performed and a defect may also occur due to residues of the corresponding layer. Accordingly, the contact electrode material layer CNL disposed under the intermediate layer PML may be made of a material resistant to deformation due to a drying process, and the connection electrodes BR1 and BR2 disposed on the intermediate layer PML may be formed by patterning before the drying process. Since the connection electrodes BR1 and BR2 may be patterned prior to the drying process, deformation due to the drying process may occur and there may be no adverse effects.

According to an embodiment, the connection electrodes BR1 and BR2 may include ITO, and the contact electrode material layer CNL or the contact electrodes CNE1 and CNE2 formed by patterning them may include IZO. The connection electrode material layer BRL may include a-ITO, and after the drying process of the intermediate layer PML may be performed, the a-ITO may become ITO. The connection electrodes BR1 and BR2 may be formed before the drying process (bake) of the intermediate layer PML, and the material thereof may be changed to ITO by the drying process. Since the contact electrode material layer CNL includes IZO, deformation may not occur even in the drying process and a patterning process in a subsequent process may be smoothly performed.

Figure 14:
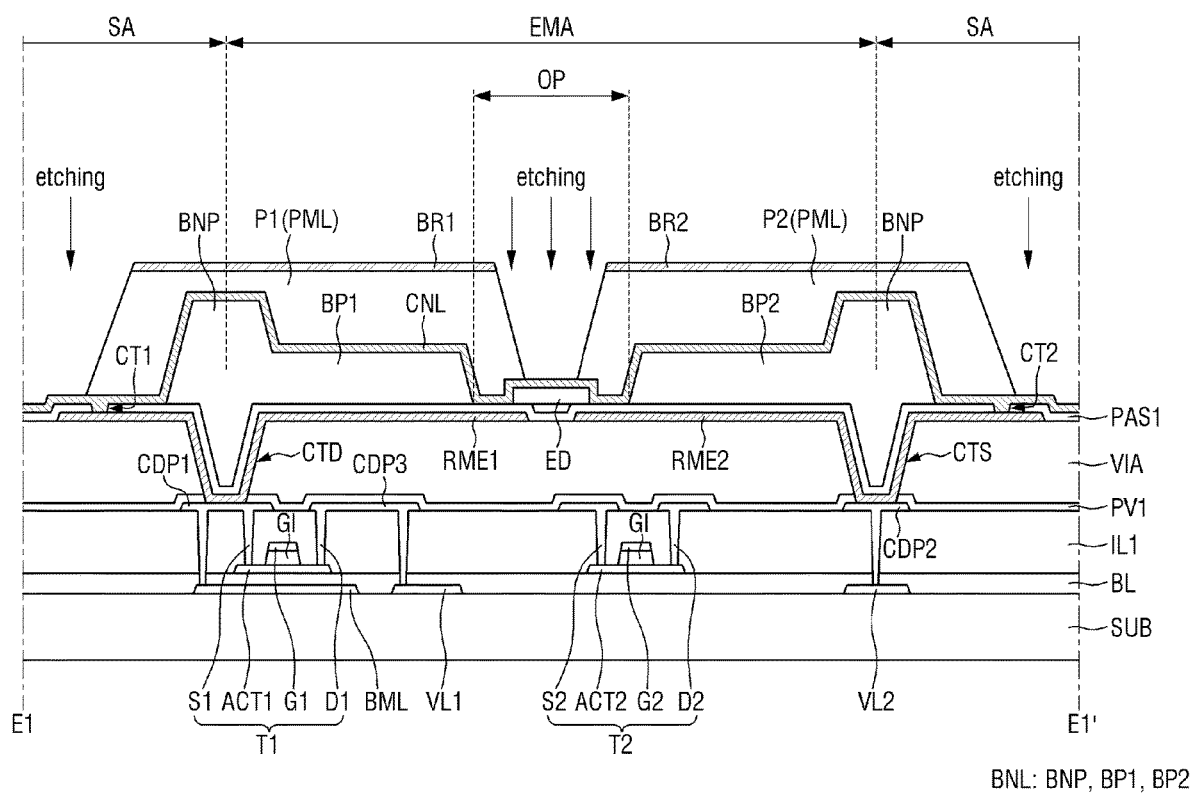

Referring to FIG. 14, the contact electrode material layer CNL may be patterned using the connection electrodes BR1 and BR2 and the intermediate layer PML as masks. A portion of the contact electrode material layer CNL in which the connection electrodes BR1 and BR2 and the pattern portions P1 and P2 of the intermediate layer PML may not be disposed may be removed. The connection electrodes BR1 and BR2 and the pattern portions P1 and P2 may be formed not to overlap a portion of the light emitting element ED, and the exposed contact electrode material layer CNL may be removed from the portion. A portion of the contact electrode material layer CNL covering the light emitting element ED may be partially removed to form contact electrodes CNE1 and CNE2 spaced apart from each other.

Hereinafter, other embodiments of the display device 10 will be described with reference to other drawings.

Figure 15:
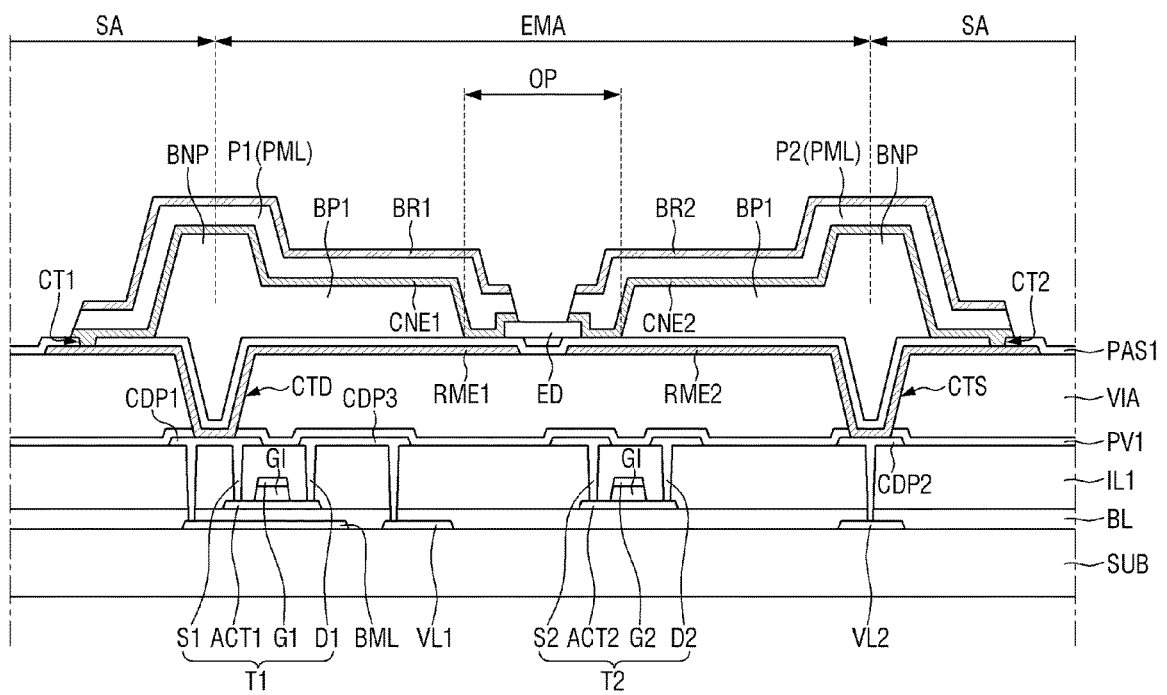
FIG. 15 is a schematic cross-sectional view of a display device according to another embodiment.

FIG. 15 is a schematic cross-sectional view of a display device according to another embodiment.

Referring to FIG. 15, in the display device 10 according to an embodiment, the intermediate layer PML may include an inorganic insulating material. The intermediate layer PML may be disposed along a stepped portion formed by the bank layer BNL and the contact electrode layer CNL that may be below the intermediate layer PML. The top surface of the intermediate layer PML may have a lower height in a portion thereof overlapping the barrier walls BP1 and BP2 compared to a portion thereof overlapping the bank portion BNP.

In the display device 10, since the intermediate layer PML includes an inorganic insulating material, a drying process may be omitted from the fabricating process, and materials of the connection electrode layer BRL and the contact electrode layer CNL may be freely selected.

Figure 16:
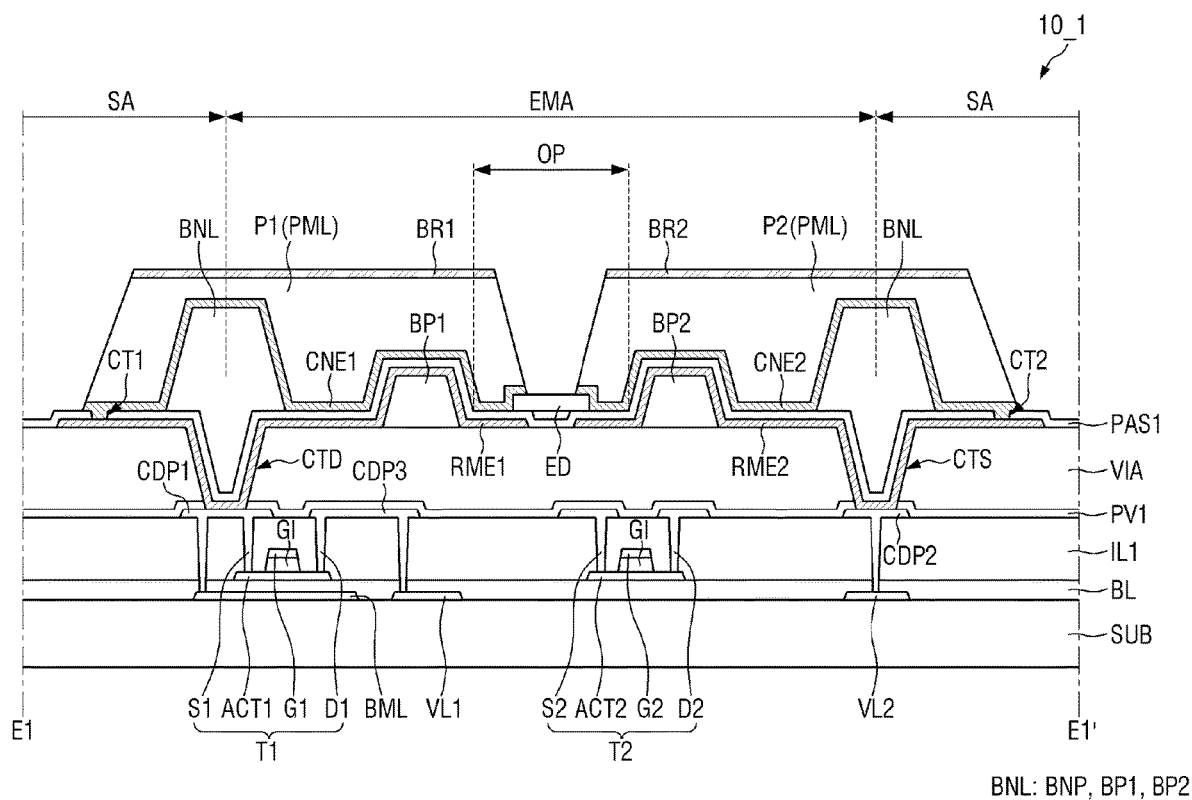
FIG. 16 is a schematic cross-sectional view of a display device according to still another embodiment.

FIG. 16 is a schematic cross-sectional view of a display device according to still another embodiment.

Referring to FIG. 16, in a display device 10_1 according to an embodiment, the bank layer BNL may be formed to be separated from the barrier walls BP1 and BP2, and the barrier walls BP1 and BP2 may be disposed between the electrodes RME1 and RME2 and the via layer VIA. An embodiment may be different from an embodiment of FIG. 5 at least in that the barrier walls BP1 and BP2 and the bank layer BNL may be separated and the stacking order thereof may be different. In the following description, redundant description will be omitted while focusing on differences.

The barrier walls BP1 and BP2 may be disposed on the via layer VIA. For example, the barrier walls BP1 and BP2 may be directly disposed on the via layer VIA, and may have a structure in which at least a portion thereof protrudes with respect to the top surface of the via layer VIA. The protruding portions of the barrier walls BP1 and BP2 may have an inclined surface or a curved surface with a certain curvature, and the light emitted from the light emitting element ED may be reflected by the electrode RME disposed on the barrier walls BP1 and BP2 and emitted in the upward direction of the via layer VIA.

The electrodes RME (RME1 and RME2) may be disposed on the barrier walls BP1 and BP2. A first electrode RME1 may be disposed on the first barrier wall BP1, and a second electrode RME2 may be disposed on the second barrier wall BP2. The first electrode RME1 and the second electrode RME2 may be arranged at least on the inclined surfaces of the barrier walls BP1 and BP2. The gap between the first electrode RME1 and the second electrode RME2 spaced apart from each other in the second direction DR2 may be smaller than the gap between the barrier walls BP1 and BP2. At least a part of the first electrode RME1 and the second electrode RME2 may be directly arranged on the via layer VIA, so that the first electrode RME1 and the second electrode RME2 may be arranged on the same plane.

The light emitting element ED disposed between the barrier walls BP1 and BP2 may emit light toward both ends, and the emitted light may be directed toward the electrodes RME disposed on the barrier walls BP1 and BP2. The electrodes RME may have a structure in which portions thereof disposed on the barrier walls BP1 and BP2 may reflect the light emitted from the light emitting element ED. The first electrode RME1 and the second electrode RME2 may be arranged to cover at least one side surface of the barrier walls BP1 and BP2 and may reflect the light emitted from the light emitting element ED.

The first insulating layer PAS1 may be disposed on the via layer VIA and the electrodes RME. In an embodiment, the first insulating layer PAS1 may have stepped portions such that the top surface thereof may be partially depressed between the electrodes RME spaced apart in the second direction DR2. The light emitting element ED may be disposed on the top surface of the first insulating layer PAS1, where the stepped portions may be formed, and thus a space may remain between the light emitting element ED and the first insulating layer PAS1.

The bank layer BNL may be disposed on the first insulating layer PAS1. The bank layer BNL may include portions extending in the first direction DR1 and the second direction DR2, and may surround the sub-pixels SPXn. The bank layer BNL may surround the emission area EMA and the sub-region SA of each sub-pixel SPXn and divide them. Similarly to the barrier walls BP1 and BP2, the bank layer BNL may have a certain height. In some embodiments, the top surface of the bank layer BNL may be higher than that of the barrier walls BP1 and BP2, and the thickness of the bank layer BNL may be equal to or greater than that of the barrier walls BP1 and BP2.

The light emitting elements ED may be disposed between the barrier walls BP1 and BP2 on the first insulating layer PAS1. The light emitting element ED may be disposed such that the first end may be disposed on the first electrode RME1 and the second end may be disposed on the second electrode RME2.

Similarly to an embodiment of FIG. 5, the contact electrode layer CNL, the intermediate layer PML, and the connection electrode layer BRL may be disposed on the first insulating layer PAS1 and the bank layer BNL. The contact electrode layer CNL, the intermediate layer PML, and the connection electrode layer BRL may be sequentially stacked on each other, and may be disposed over the emission area EMA and the sub-region SA. The contact electrodes CNE1 and CNE2 of the contact electrode layer CNL may be in contact with both ends of the light emitting element ED and the electrodes RME1 and RME2, respectively. The intermediate layer PML and the connection electrode layer BRL may have substantially the same pattern shape as the contact electrode layer CNL and may be sequentially stacked on each other. In case that the repair process of the display device 10_1 is performed, the connection electrodes BR1 and BR2 of the connection electrode layer BRL may penetrate the pattern portions P1 and P2 of the intermediate layer PML to be in contact with the contact electrodes CNE1 and CNE2. Otherwise, the connection electrodes BR1 and BR2 may be insulated from the contact electrodes CNE1 and CNE2 by the intermediate layer PML.

Figure 17:
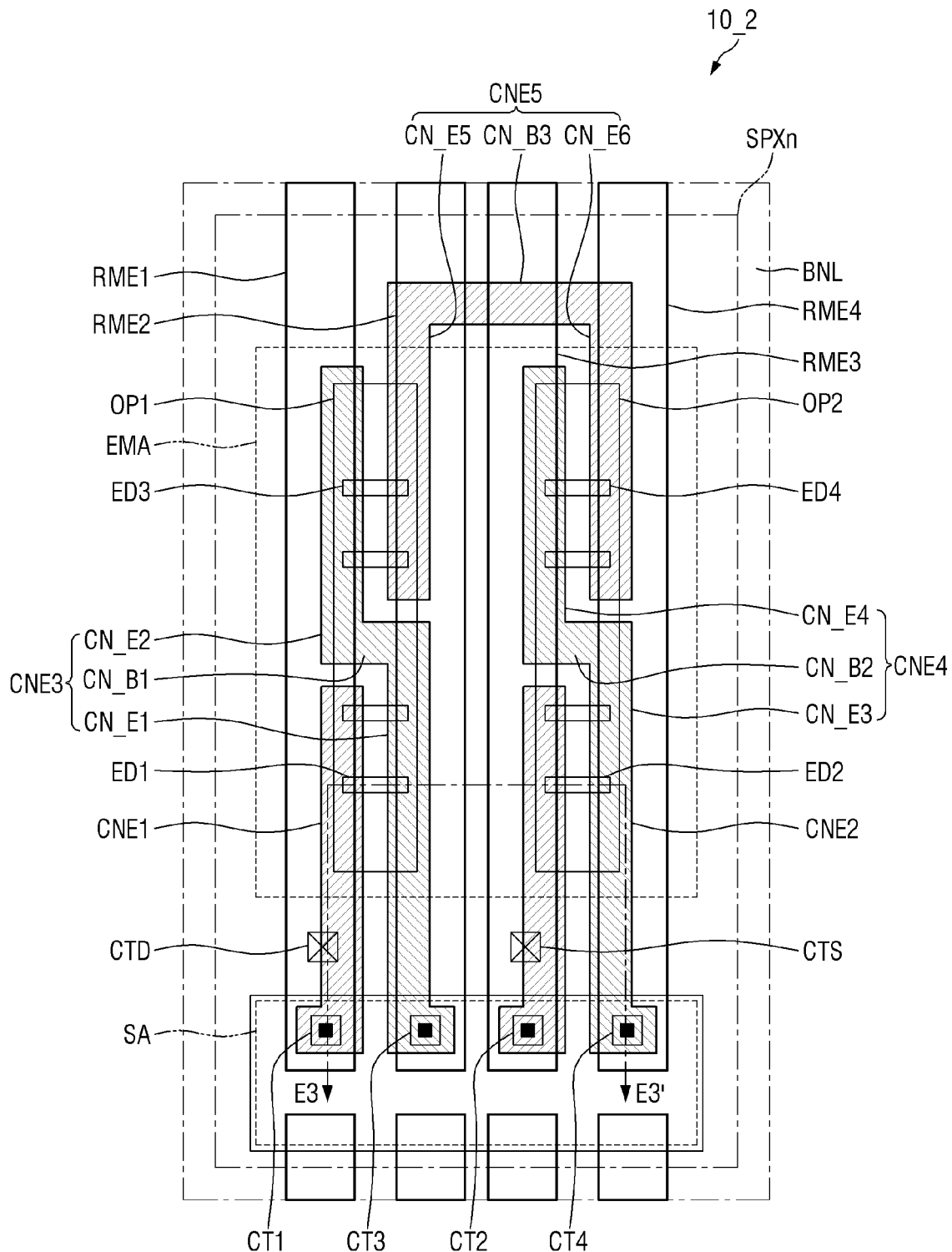
FIG. 17 is a schematic plan view of a display device according to another embodiment.
Figure 18:
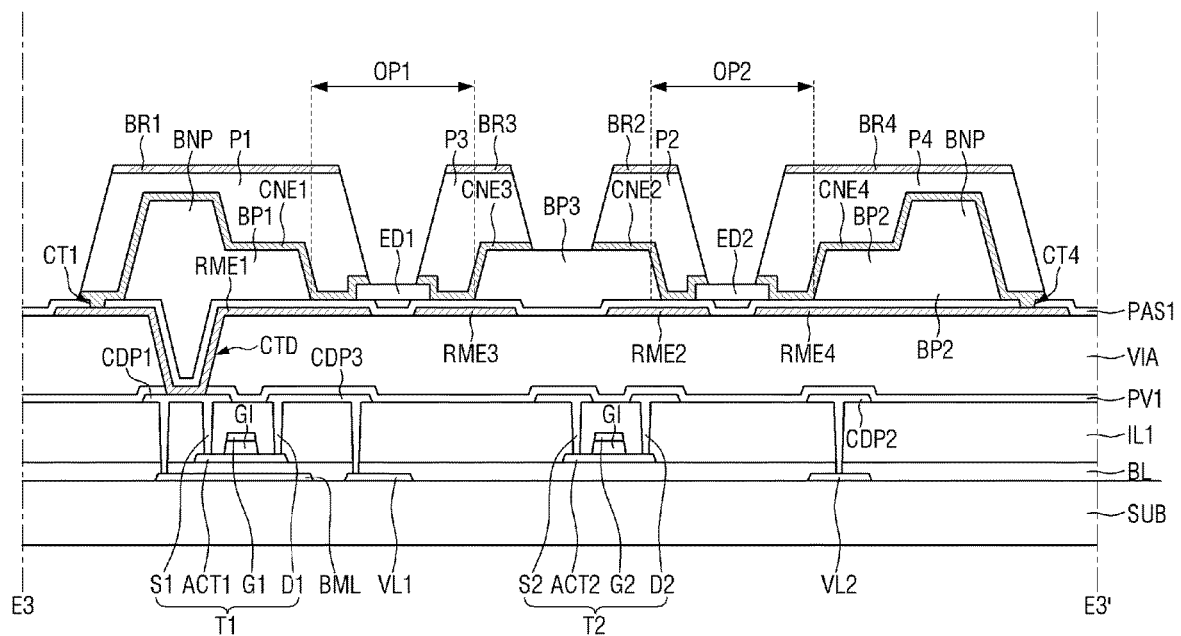
FIG. 18 is a schematic cross-sectional view taken along line E3-E3' of FIG. 17.

FIG. 17 is a schematic plan view of a display device according to another embodiment. FIG. 18 is a schematic cross-sectional view taken along line E3-E3' of FIG. 17. FIG. 18 illustrates a cross section crossing both ends of the first light emitting element ED1 and the second light emitting element ED2 disposed in the sub-pixel SPXn.

Referring to FIGS. 17 and 18, a display device 10_2 according to an embodiment may include a greater number of electrodes RME1, RME2, RME3, and RME4, light emitting elements ED1, ED2, ED3, and ED4, and contact electrodes CNE1, CNE2, CNE3, CNE4, and CNE5 of the contact electrode layer CNL, for each sub-pixel SPXn. Although not illustrated in FIG. 17, the intermediate layer PML and the connection electrode layer BRL may include a greater number of pattern portions P1, P2, P3, and P4 and the connection electrodes BR1, BR2, BR3, and BR4 corresponding to the shape of the contact electrode layer CNL. The display device 10_2 according to an embodiment may be different from an embodiment of FIGS. 2 to 5 at least in that a larger number of electrodes and a larger number of light emitting elements may be included in each sub-pixel SPXn.

The electrodes RME arranged for each sub-pixel SPXn may further include a third electrode RME3 and a fourth electrode RME4 in addition to a first electrode RME1 and a second electrode RME2.

The third electrode RME3 may be disposed between the first electrode RME1 and the second electrode RME2, and the fourth electrode RME4 may be spaced apart from the third electrode RME3 in the second direction DR2 with the second electrode RME2 interposed therebetween. The electrodes RME may be sequentially arranged in the order of the first electrode RME1, the third electrode RME3, the second electrode RME2, and the fourth electrode RME4 from the left side to the right side of the sub-pixel SPXn. The electrodes RME may face and be spaced apart from each other in the second direction DR2. The electrodes RME may be spaced apart from the electrodes RME of another sub-pixel SPXn adjacent in the first direction DR1 at the separation portion ROP of the sub-region SA.

Among the electrodes RME, the first electrode RME1 and the second electrode RME2 may be in contact with the first conductive pattern CDP1 and the second conductive pattern CDP2 (illustrated in FIG. 5) in a lower portion through the electrode contact holes CTD and CTS disposed under the bank portion BNP of the bank layer BNL, respectively, but the third electrode RME3 and the fourth electrode RME4 may not.

The first insulating layer PAS1 may be disposed in a structure similar to that in the above-described embodiments. The first insulating layer PAS1 may be disposed entirely in the display area DPA and may cover the electrodes RME.

According to an embodiment, the first insulating layer PAS1 may include contact portions CT1, CT2, CT3, and CT4. The contact portions CT1, CT2, CT3, and CT4 of the first insulating layer PAS1 may be disposed to overlap different electrodes RME. For example, the contact portions CT1, CT2, CT3, and CT4 may be disposed in the sub-region SA, and may include the first contact portion CT1 disposed to overlap the first electrode RME1, the second contact portion CT2 disposed to overlap the second electrode RME2, the third contact portion CT3 disposed to overlap the third electrode RME3, and the fourth contact portion CT4 disposed to overlap the fourth electrode RME4. The contact portions CT1, CT2, CT3, and CT4 may penetrate the first insulating layer PAS1 to partially expose the top surfaces of the electrodes RME1, RME2, RME3, and RME4 disposed thereunder, respectively. Each of the contact portions CT1, CT2, CT3, and CT4 may further penetrate some of the other insulating layers disposed on the first insulating layer PAS1.

The bank layer BNL may be disposed on the first insulating layer PAS1. The barrier walls BP1, BP2, and BP3 of the bank layer BNL may further include a third barrier wall BP3 disposed between the first barrier wall BP1 and the second barrier wall BP2. The first barrier wall BP1 may be located on the left side with respect to the center of the emission area EMA, the second barrier wall BP2 may be located on the right side with respect to the center of the emission area EMA, and the third barrier wall BP3 may be located at the center of the emission area EMA. The bank layer BNL may include a first opening OP1 and a second opening OP2 disposed in the emission area EMA, and the first to third barrier walls BP1, BP2, and BP3 may be spaced apart from each other with each of the openings OP1 and OP2 interposed therebetween. For example, the first barrier wall BP1 and the third barrier wall BP3 may be spaced apart from each other with the first opening OP1 therebetween, and the third barrier wall BP3 and the second barrier wall BP2 may be spaced apart from each other with the second opening OP2 therebetween.

The width of the third barrier wall BP3 measured in the second direction DR2 may be greater than those of the first barrier wall BP1 and the second barrier wall BP2 measured in the second direction DR2. The gap between the barrier walls BP1, BP2, and BP3 in the second direction DR2 may be greater than the gap between the electrodes RME. The first barrier wall BP1 may be disposed to partially overlap the first electrode RME1, and the second barrier wall BP2 may be disposed to partially overlap the fourth electrode RME4. The third barrier wall BP3 may be disposed to partially overlap the second electrode RME2 and the third electrode RME3. At least parts of the electrodes RME may be arranged without overlapping the barrier walls BP1, BP2, and BP3.

The bank portion BNP of the bank layer BNL may include portions extending in the first direction DR1 and the second direction DR2, and may surround the sub-pixels SPXn. The bank portion BNP may surround the emission area EMA and the sub-region SA of each sub-pixel SPXn and divide them. The disposition of the bank portion BNP may be substantially the same as described above.

The light emitting elements ED may be disposed on different electrodes RME between the openings OP1 and OP2 of the bank layer BNL or among the barrier walls BP1, BP2, and BP3. A portion of the light emitting elements ED may be disposed in the first opening OP1 between the first barrier wall BP1 and the third barrier wall BP3, and other portions of the light emitting elements ED may be disposed in the second opening OP2 between the third barrier wall BP3 and the second barrier wall BP2. In accordance with an embodiment, the light emitting element ED may include a first light emitting element ED1 and a third light emitting element ED3 arranged between the first barrier wall BP1 and the third barrier wall BP3, and a second light emitting element ED2 and a fourth light emitting element ED4 arranged between the third barrier wall BP3 and the second barrier wall BP2. Each of the first light emitting element ED1 and the third light emitting element ED3 may be disposed above the first electrode RME1 and the third electrode RME3, and each of the second light emitting element ED2 and the fourth light emitting element ED4 may be disposed above the second electrode RME2 and the fourth electrode RME4. The first light emitting element ED1 and the second light emitting element ED2 may be arranged adjacent to the lower side of the emission area EMA of the corresponding sub-pixel SPXn or adjacent to the sub-region SA, and the third light emitting element ED3 and the fourth light emitting element ED4 may be arranged adjacent to the upper side of the emission area EMA of the corresponding sub-pixel SPXn.

However, the light emitting elements ED may not be classified according to the arrangement position in the emission area EMA, but may be classified according to a connection relationship with the contact electrodes CNE1, CNE2, CNE3, CNE4, and CNE5, which will be described later. Both ends of each light emitting element ED may be in contact with different contact electrodes CNE according to an arrangement method of the contact electrodes CNE. The light emitting elements ED may be classified into different types of light emitting elements ED according to the type of the contact electrode CNE in contact therewith.

The contact electrodes CNE1, CNE2, CNE3, CNE4, and CNE5 of the contact electrode layer CNL may further include the third contact electrode CNE3, the fourth contact electrode CNE4, and the fifth contact electrode CNE5 disposed across the electrodes RME in addition to the first contact electrode CNE1 disposed on the first electrode RME1 and the second contact electrode CNE2 disposed on the second electrode RME2.

Unlike an embodiment of FIG. 2, the extension length of each of the first contact electrode CNE1 and the second contact electrode CNE2 in the first direction DR1 may be relatively short. The first contact electrode CNE1 and the second contact electrode CNE2 may be arranged on the lower side with respect to the center of the emission area EMA. The first contact electrode CNE1 and the second contact electrode CNE2 may be disposed across the emission area EMA and the sub-region SA of the corresponding sub-pixel SPXn, and may be in direct contact with the electrode RME through the first and second contact portions CT1 and CT2 formed in the sub-region SA, respectively. The first contact electrode CNE1 may be directly in contact with the first electrode RME1 in the sub-region SA through the first contact portion CT1 penetrating the first insulating layer PAS1, and the second contact electrode CNE2 may be in contact with the second electrode RME2 in the sub-region SA through the second contact portion CT2 penetrating the first insulating layer PAS1.

The third contact electrode CNE3 may include a first extension portion CN_E1 disposed on the third electrode RME3, a second extension portion CN_E2 disposed on the first electrode RME1, and a first connection portion CN_B1 that connects the first extension portion CN_E1 to the second extension portion CN_E2. The first extension portion CN_E1 may face and be spaced apart from the first contact electrode CNE1 in the second direction DR2, and the second extension portion CN_E2 may be spaced apart from the first contact electrode CNE1 in the first direction DR1. The first extension portion CN_E1 may be disposed on the lower side of the emission area EMA of the corresponding sub-pixel SPXn, and the second extension portion CN_E2 may be disposed on the upper side of the emission area EMA. The first extension portion CN_E1 and the second extension portion CN_E2 may be disposed in the emission area EMA. The first connection portion CN_B1 may be disposed across the first electrode RME1 and the third electrode RME3 at the central portion of the emission area EMA. The third contact electrode CNE3 may have a shape substantially extending in the first direction DR1, and may have a shape that may be bent in the second direction DR2 and extends in the first direction DR1 again.

The fourth contact electrode CNE4 may include a third extension portion CN_E3 disposed on the fourth electrode RME4, a fourth extension portion CN_E4 disposed on the second electrode RME2, and a second connection portion CN_B2 that connects the third extension portion CN_E3 to the fourth extension portion CN_E4. The third extension portion CN_E3 may face and be spaced apart from the second contact electrode CNE2 in the second direction DR2, and the fourth extension portion CN_E4 may be spaced apart from the second contact electrode CNE2 in the first direction DR1. The third extension portion CN_E3 may be disposed on the lower side of the emission area EMA of the corresponding sub-pixel SPXn, and the fourth extension portion CN_E4 may be disposed on the upper side of the emission area EMA. The third extension portion CN_E3 and the fourth extension portion CN_E4 may be disposed in the emission area EMA. The second connection portion CN_B2 may be disposed across the second electrode RME2 and the fourth electrode RME4 while being adjacent to the center of the emission area EMA. The fourth contact electrode CNE4 may have a shape substantially extending in the first direction DR1, and may have a shape that may be bent in the second direction DR2 and extends in the first direction DR1 again.

The fifth contact electrode CNE5 may include a fifth extension portion CN_E5 disposed on the third electrode RME3, a sixth extension portion CN_E6 disposed on the fourth electrode RME4, and a third connection portion CN_B3 that connects the fifth extension portion CN_E5 to the sixth extension portion CN_E6. The fifth extension portion CN_E5 may face and be spaced apart from the second extension portion CN_E2 of the third contact electrode CNE3 in the second direction DR2, and the sixth extension portion CN_E6 may face and be spaced apart from the fourth extension portion CN_E4 of the fourth contact electrode CNE4 in the second direction DR2. Each of the fifth extension portion CN_E5 and the sixth extension portion CN_E6 may be arranged on the upper side of the emission area EMA, and the third connection portion CN_B3 may be disposed across the third electrode RME3, the second electrode RME2, and the fourth electrode RME4. The fifth contact electrode CNE5 may be disposed to surround the fourth extension portion CN_E4 of the fourth contact electrode CNE4 in plan view.

The third contact electrode CNE3 may be directly in contact with the third electrode RME3 in the sub-region SA through the third contact portion CT3 penetrating the first insulating layer PAS1, and the fourth contact electrode CNE4 may be in contact with the fourth electrode RME4 in the sub-region SA through the fourth contact portion CT4 penetrating the first insulating layer PAS1.

The first contact electrode CNE1 and the second contact electrode CNE2 may be the first type contact electrodes connected to the electrodes RME1 and RME2 directly connected to the third conductive layer, respectively. The third contact electrode CNE3 and the fourth contact electrode CNE4 may be the second type contact electrodes connected to the electrodes RME3 and RME4 that may not be connected to the third conductive layer. The fifth contact electrode CNE5 may be the third type contact electrode that may not be connected to the electrode RME. The fifth contact electrode CNE5 may be in contact with the light emitting elements ED without being connected to the electrode RME and may constitute an electrical connection circuit of the light emitting elements ED together with other contact electrodes CNE.

The third contact electrode CNE3 and the fourth contact electrode CNE4 that may be the second type contact electrodes may be contact electrodes in which electrode extension portions extending in the first direction DR1 may not be parallel to each other in the second direction DR2. The fifth contact electrode CNE5 that may be the third type contact electrode may be the contact electrode in which electrode extension portions extending in the first direction DR1 may be parallel to each other in the second direction DR2. The third contact electrode CNE3 and the fourth contact electrode CNE4 may have a shape that may be bent while extending in the first direction DR1, and the fifth contact electrode CNE5 may have a shape surrounding a part of another contact electrode.

Each of the intermediate layer PML and the connection electrode layer BRL disposed on the contact electrode layer CNL may have a pattern shape similar to that of the contact electrode layer CNL. The intermediate layer PML may include the first pattern portion P1 disposed on the first contact electrode CNE1, the second pattern portion P2 disposed on the second contact electrode CNE2, the third pattern portion P3 disposed on the third contact electrode CNE3, and the fourth pattern portion P4 disposed on the fourth contact electrode CNE4. In addition, although not illustrated in the drawings, the intermediate layer PML may include a fifth pattern portion disposed on the fifth contact electrode CNE5. The connection electrode layer BRL may include the first connection electrode BR1 disposed on the first pattern portion P1, the second connection electrode BR2 disposed on the second pattern portion P2, the third connection electrode BR3 disposed on the third pattern portion P3, and the fourth connection electrode BR4 disposed on the fourth pattern portion P4. In addition, although not illustrated in the drawings, the connection electrode layer BRL may include a fifth connection electrode disposed on the fifth pattern portion. The description of the stacking relationship among the contact electrode layer CNL, the intermediate layer PML, and the connection electrode layer BRL and the disposition relationship with the bank layer BNL may be substantially the same as described above.

The first contact electrode CNE1 may be in contact with the first end of the first light emitting element ED1 and the second contact electrode CNE2 may be in contact with the second end of the second light emitting element ED2. The third contact electrode CNE3 may be in contact with the second end of the first light emitting element ED1 and the first end of the third light emitting element ED3. The fourth contact electrode CNE4 may be in contact with the second end of the fourth light emitting element ED4 and the first end of the second light emitting element ED2. The fifth contact electrode CNE5 may be in contact with the second end of the third light emitting element ED3 and the first end of the fourth light emitting element ED4.

The light emitting elements ED may be classified into different light emitting elements ED depending on the contact electrodes CNE to be in contact with both ends of the light emitting elements ED to correspond to the arrangement structure of the contact electrodes CNE. The first light emitting element ED1 and the second light emitting element ED2 may have first ends in contact with the first type contact electrodes and second ends in contact with the second type contact electrodes. The first light emitting element ED1 may be in contact with the first contact electrode CNE1 and the third contact electrode CNE3, and the second light emitting element ED2 may be in contact with the second contact electrode CNE2 and the second contact electrode CNE4. The third light emitting element ED3 and the fourth light emitting element ED4 may have first ends in contact with the second type contact electrodes and second ends in contact with the third type contact electrodes. The third light emitting element ED3 may be in contact with the third contact electrode CNE3 and the fifth contact electrode CNE5, and the fourth light emitting element ED4 may be in contact with the fourth contact electrode CNE4 and the fifth contact electrode CNE5.

The light emitting elements ED may be connected in series through the contact electrodes CNE. Since the display device 10 according to an embodiment includes a larger number of light emitting elements ED for each sub-pixel SPXn and the light emitting elements ED may be connected in series, the light emission amount per unit area may be further increased.

Figure 19:
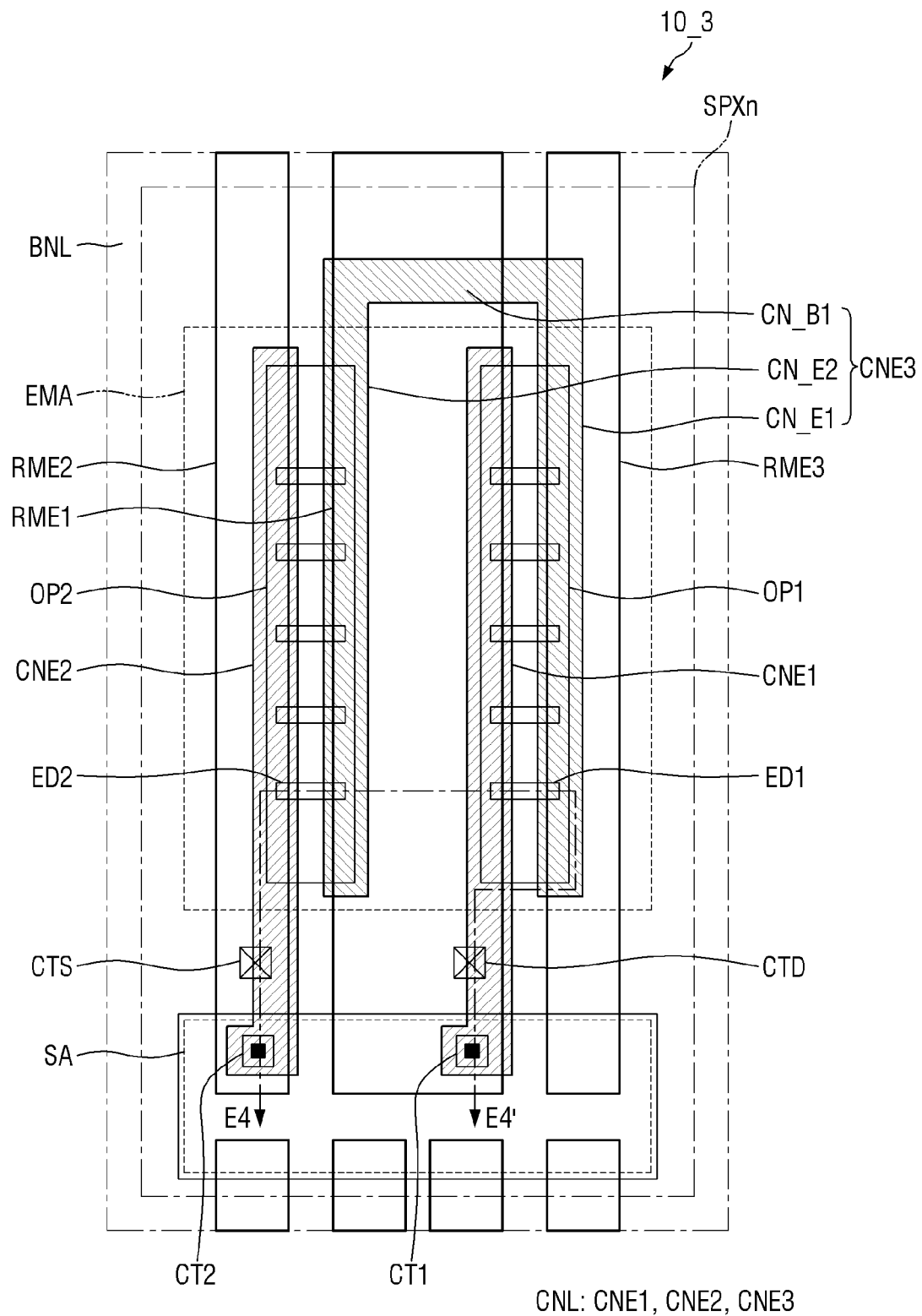
FIG. 19 is a schematic plan view of a display device according to another embodiment.
Figure 20:
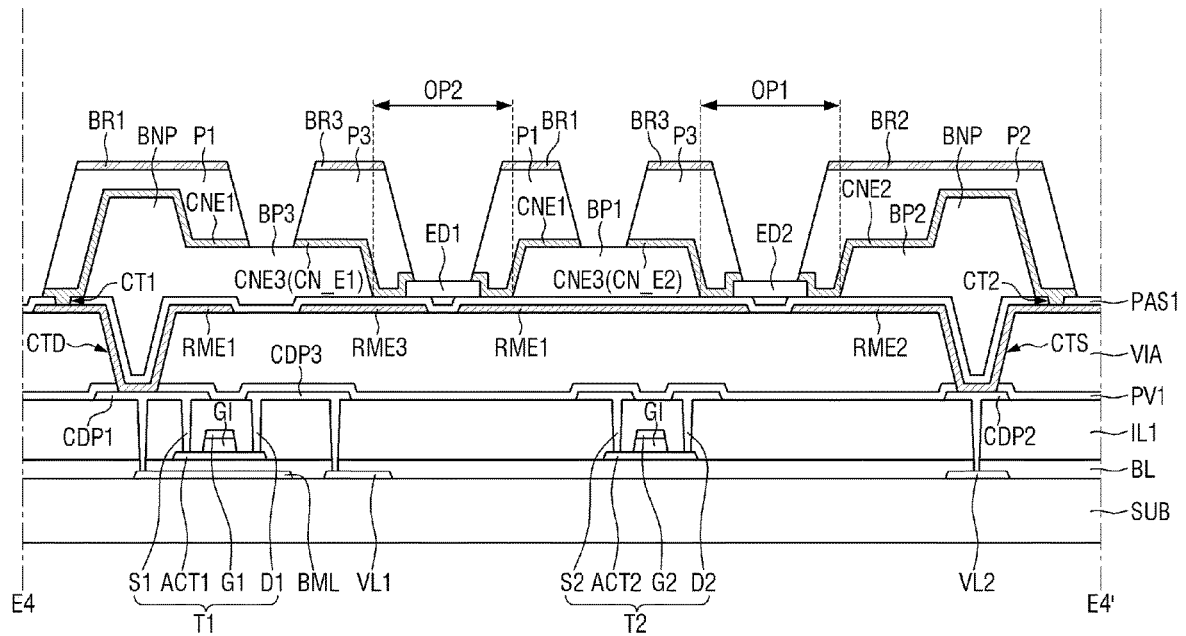
FIG. 20 is a schematic cross-sectional view taken along line E4-E4' in FIG. 19.

FIG. 19 is a schematic plan view of a display device according to another embodiment. FIG. 20 is a schematic cross-sectional view taken along line E4-E4' in FIG. 19. FIG. 20 illustrates a cross section crossing both ends of the first light emitting element ED1 and the second light emitting element ED2 disposed in the sub-pixel SPXn.

Referring to FIGS. 19 and 20, in a display device 10_3 according to an embodiment, the electrodes RME1, RME2, and RME3, the light emitting elements ED1 and ED2, and the contact electrodes CNE1, CNE2, and CNE3 of the contact electrode layer CNL of each sub-pixel SPXn may have different disposition structures. Although not illustrated in FIG. 19, corresponding to the shape of the contact electrode layer CNL, the pattern portions P1, P2, and P3 and the connection electrodes BR1, BR2, and BR3 in the intermediate layer PML and the connection electrode layer BRL may have a different disposition structure. Hereinafter, the redundant description of the above-described embodiments will be omitted while focusing on differences.

The electrodes RME arranged for each sub-pixel SPXn may further include a third electrode RME3 in addition to a first electrode RME1 and a second electrode RME2.

The third electrode RME3 may be disposed to be spaced apart from the second electrode RME2 with the first electrode RME1 interposed therebetween. As for the electrodes RME, the second electrode RME2, the first electrode RME1, and the third electrode RME3 may be sequentially disposed from the left side to the right side of the sub-pixel SPXn. The electrodes RME may face and be spaced apart from each other in the second direction DR2. The electrodes RME may be spaced apart from the electrodes RME of another sub-pixel SPXn adjacent in the first direction DR1 at the separation portion ROP of the sub-region SA.

Unlike the above-described embodiments, the width of the first electrode RME1 measured in the second direction DR2 may be greater than that of the second electrode RME2 and the third electrode RME3. Accordingly, one end of each of the light emitting elements ED1 and ED2 disposed in different openings OP1 and OP2, which will be described later, may be disposed on the first electrode RME1.

Among the electrodes RME, the first electrode RME1 and the second electrode RME2 may be in contact with the first conductive pattern CDP1 and the second conductive pattern CDP2 in a lower portion through the electrode contact holes CTD and CTS disposed under the bank portion BNP of the bank layer BNL, respectively, but the third electrode RME3 may not.

The first insulating layer PAS1 may be disposed in a structure similar to that in the above-described embodiments. The first insulating layer PAS1 may be disposed entirely in the display area DPA and may cover the electrodes RME.

According to an embodiment, the first insulating layer PAS1 may include the contact portions CT1 and CT2. Each of the contact portions CT1 and CT2 of the first insulating layer PAS1 may be disposed on different electrodes RME. For example, the contact portions CT1 and CT2 may be disposed in the sub-region SA, and may include the first contact portion CT1 disposed to overlap the first electrode RME1 and the second contact portion CT2 disposed in the sub-region SA to overlap the second electrode RME2. The contact portions CT1 and CT2 may penetrate the first insulating layer PAS1 to expose a portion of top surfaces of the lower electrodes RME1 and RME2. Each of the contact portions CT1 and CT2 may further penetrate some of the other insulating layers disposed on the first insulating layer PAS1.

The bank layer BNL may be disposed on the first insulating layer PAS1. The barrier walls BP1, BP2, and BP3 of the bank layer BNL may further include the first barrier wall BP1 and the second barrier wall BP2, and the third barrier wall BP3 spaced apart from the second barrier wall BP2 with the first barrier wall BP1 interposed therebetween. The first barrier wall BP1 may be located at the center of the emission area EMA, the second barrier wall BP2 may be located on the left side with respect to the center of the emission area EMA, and the third barrier wall BP3 may be located on the right side with respect to the emission area EMA. The bank layer BNL may include a first opening OP1 and a second opening OP2 disposed in the emission area EMA, and the first to third barrier walls BP1, BP2, and BP3 may be spaced apart from each other with each of the openings OP1 and OP2 interposed therebetween. For example, the first barrier wall BP1 and the third barrier wall BP3 may be spaced apart from each other with the first opening OP1 therebetween, and the third barrier wall BP3 and the second barrier wall BP2 may be spaced apart from each other with the second opening OP2 therebetween.

The width of the first barrier wall BP1 measured in the second direction DR2 may be greater than those of the second barrier wall BP2 and the third barrier wall BP3 measured in the second direction DR2. The gap between the barrier walls BP1, BP2, and BP3 in the second direction DR2 may be greater than the gap between the electrodes RME. The first barrier wall BP1 may be disposed to overlap the first electrode RME1, the second barrier wall BP2 may be disposed to partially overlap the second electrode RME2, and the third barrier wall BP3 may be disposed to partially overlap the third electrode RME3. At least parts of the electrodes RME may be arranged without overlapping the barrier walls BP1, BP2, and BP3.

The bank portion BNP of the bank layer BNL may include portions extending in the first direction DR1 and the second direction DR2, and may surround the sub-pixels SPXn. The bank portion BNP may surround the emission area EMA and the sub-region SA of each sub-pixel SPXn and divide them. The disposition of the bank portion BNP may be substantially the same as described above.

The light emitting elements ED may be disposed on different electrodes RME between the openings OP1 and OP2 of the bank layer BNL or among the barrier walls BP1, BP2, and BP3. A portion of the light emitting elements ED may be disposed in the first opening OP1 between the first barrier wall BP1 and the third barrier wall BP3, and other portions of the light emitting elements ED may be disposed in the second opening OP2 between the third barrier wall BP3 and the second barrier wall BP2. In accordance with an embodiment, the light emitting element ED may include a first light emitting element ED1 arranged between the first barrier wall BP1 and the third barrier wall BP3, and a second light emitting element ED2 arranged between the third barrier wall BP3 and the second barrier wall BP2. The first light emitting element ED1 may be disposed on the first electrode RME1 and the third electrode RME3, and the second light emitting element ED2 may be disposed on the first electrode RME1 and the second electrode RME2.

However, the light emitting elements ED may not be classified according to the arrangement position in the emission area EMA, but may be classified according to a connection relationship with the contact electrodes CNE1, CNE2, and CNE3, which will be described later. Ends of each light emitting element ED may be in contact with different contact electrodes CNE according to an arrangement method of the contact electrodes CNE. The light emitting elements ED may be classified into different types of light emitting elements ED according to the type of the contact electrode CNE in contact therewith.

The contact electrodes CNE1, CNE2, and CNE3 of the contact electrode layer CNL may include the third contact electrode CNE3 disposed across the third electrodes RME3 and the first electrode RME1 in addition to the first contact electrode CNE1 disposed on the first electrode RME1 and the second contact electrode CNE2 disposed on the second electrode RME2.

The first contact electrode CNE1 may have a shape extending in the first direction DR1 and may be disposed on the first electrode RME1. The first contact electrode CNE1 may overlap the first electrode RME1, extend from the emission area EMA in the first direction DR1, and be disposed even in the sub-region SA beyond the bank layer BNL. The first contact electrode CNE1 may be in contact with the first electrode RME1 through the first contact portion CT1 in the sub-region SA.

The second contact electrode CNE2 may have a shape extending in the first direction DR1 and may be disposed on the second electrode RME2. The second contact electrode CNE2 may overlap the second electrode RME2, extend from the emission area EMA in the first direction DR1, and be disposed even in the sub-region SA beyond the bank layer BNL. The second contact electrode CNE2 may be in contact with the second electrode RME2 through the second contact portion CT2 in the sub-region SA.

The third contact electrode CNE3 may include the extension portions CN_E1 and CN_E2 extending in the first direction DR1 and a first connection portion CN_B1 connecting the extension portions CN_E1 and CN_E2. The first extension portion CN_E1 faces the first contact electrode CNE1 in the emission area EMA and may be disposed on the third electrode RME3, and the second extension portion CN_E2 faces the second contact electrode CNE2 in the emission area EMA and may be disposed on the first electrode RME1. The first connection portion CN_B1 may extend in the second direction DR2 on the bank layer BNL positioned on the upper side of the emission area EMA to connect the first extension portion CN_E1 to the second extension portion CN_E2. The third contact electrode CNE3 may be disposed on the emission area EMA and the bank layer BNL, and may not be directly connected to the electrode RME.

The first contact electrode CNE1 and the second contact electrode CNE2 may be first type contact electrodes connected to the electrodes RME1 and RME2 directly connected to the third conductive layer, respectively, and the third contact electrode CNE3 may be a third type contact electrode that may not be connected to the electrode RME. The third contact electrode CNE3 may be in contact with the light emitting elements ED without being connected to the electrode RME and may constitute an electrical connection circuit of the light emitting elements ED together with other contact electrodes CNE.

Each of the intermediate layer PML and the connection electrode layer BRL disposed on the contact electrode layer CNL may have a pattern shape similar to that of the contact electrode layer CNL. The intermediate layer PML may include the first pattern portion P1 disposed on the first contact electrode CNE1, the second pattern portion P2 disposed on the second contact electrode CNE2, and the third pattern portion P3 disposed on the third contact electrode CNE3. The connection electrode layer BRL may include the first connection electrode BR1 disposed on the first pattern portion P1, the second connection electrode BR2 disposed on the second pattern portion P2, and the third connection electrode BR3 disposed on the third pattern portion P3. The description of the stacking relationship among the contact electrode layer CNL, the intermediate layer PML, and the connection electrode layer BRL and the disposition relationship with the bank layer BNL may be substantially the same as described above.

The first contact electrode CNE1 may be in contact with the first end of the first light emitting element ED1 and the second contact electrode CNE2 may be in contact with the second end of the second light emitting element ED2. The third contact electrode CNE3 may be in contact with the second end of the first light emitting element ED1 and the first end of the second light emitting element ED2.

The light emitting elements ED may be classified into different light emitting elements ED depending on the contact electrodes CNE to be in contact with both ends of the light emitting elements ED to correspond to the arrangement structure of the contact electrodes CNE. The first light emitting element ED1 and the second light emitting element ED2 may have first ends in contact with the first type contact electrodes and second ends in contact with the second type contact electrodes. The first light emitting element ED1 may be in contact with the first contact electrode CNE1 and the third contact electrode CNE3, and the second light emitting element ED2 may be in contact with the second contact electrode CNE2 and the third contact electrode CNE3.

The light emitting elements ED may be connected in series through the contact electrodes CNE. Since the display device 10_3 according to an embodiment includes a larger number of light emitting elements ED for each sub-pixel SPXn and the light emitting elements ED may be connected in series, the light emission amount per unit area may be further increased.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:

1. A display device comprising:
    a first electrode disposed on a substrate;
    a second electrode spaced apart from the first electrode;
    a first insulating layer disposed on the first electrode and the second electrode;
    light emitting elements disposed on the first electrode and the second electrode on the first insulating layer;
    a bank layer disposed on the first insulating layer and including an opening in which the light emitting elements are disposed;
    a contact electrode layer disposed on the light emitting elements and the bank layer, the contact electrode layer including a first contact electrode and a second contact electrode that are spaced apart from each other on the light emitting elements;
    an intermediate layer disposed on the contact electrode layer and including a first pattern portion disposed on the first contact electrode and a second pattern portion spaced apart from the first pattern portion and disposed on the second contact electrode; and
    a connection electrode layer disposed on the intermediate layer and including a first connection electrode disposed on the first pattern portion and a second connection electrode spaced apart from the first connection electrode and disposed on the second pattern portion,
    wherein side edges of the first contact electrode and the second contact electrode facing each other are parallel to side edges of the first pattern portion and the second pattern portion facing each other.

2. The display device of claim 1, wherein the side edges of the first pattern portion and the second pattern portion facing each other are parallel to side edges of the first connection electrode and the second connection electrode facing each other.

3. The display device of claim 1, wherein outer side edges opposite to the side edges of the first contact electrode and the second contact electrode facing each other are parallel to outer side edges opposite to the side edges of the first pattern portion and the second pattern portion facing each other.

4. The display device of claim 1, wherein
    each of the contact electrode layer and the connection electrode layer includes at least one of ITO, IZO, ITZO, and aluminum, and
    the intermediate layer includes an insulating material.

5. The display device of claim 4, wherein
    the intermediate layer includes an organic insulating material,
    the contact electrode layer includes IZO, and
    the connection electrode layer includes ITO.

6. The display device of claim 4, wherein the intermediate layer includes an inorganic insulating material.

7. The display device of claim 1, wherein a gap between the first contact electrode and the second contact electrode is less than or equal to a gap between the first connection electrode and the second connection electrode.

8. The display device of claim 1, wherein
    the first contact electrode is in contact with a first end of the light emitting elements, and
    the second contact electrode is in contact with a second end of the light emitting elements.

9. The display device of claim 1, wherein
    the first contact electrode is in contact with the first electrode through a first contact portion penetrating the first insulating layer without overlapping the bank layer, and
    the second contact electrode is in contact with the second electrode through a second contact portion penetrating the first insulating layer without overlapping the bank layer.

10. The display device of claim 9, wherein
    the first contact electrode includes:
        a first contact portion in contact with the light emitting elements; and
        a second contact portion separated from the first contact portion and in contact with the first electrode, and
    the first connection electrode is in contact with each of the first contact portion and the second contact portion through a contact hole penetrating the first pattern portion.

11. The display device of claim 1, wherein
    the bank layer includes:
        a first barrier wall disposed on the first electrode;
        a second barrier wall spaced apart from the first barrier wall with the opening therebetween and disposed on the second electrode; and
        a bank portion having a thickness greater than a thickness of the first barrier wall and the second barrier wall and surrounding a portion in which the light emitting elements are disposed, and
    the light emitting elements are disposed between the first barrier wall and the second barrier wall.

12. The display device of claim 11, wherein the first barrier wall, the second barrier wall, and the bank portion are integrated with each other.

13. The display device of claim 11, wherein
    the first contact electrode is in contact with the light emitting elements and is disposed directly on the first barrier wall and the bank portion, and
    the second contact electrode is in contact with the light emitting elements and is disposed directly on the second barrier wall and the bank portion.

14. The display device of claim 13, wherein
    each of the first pattern portion and the first connection electrode overlaps the first barrier wall in a thickness direction, and
    each of the second pattern portion and the second connection electrode overlaps the second barrier wall in the thickness direction.

15. The display device of claim 11, wherein a width of the opening between the first and second barrier walls is greater than a gap between the first and second contact electrodes.

16. A method for fabricating a display device, comprising:
preparing a first electrode and a second electrode that are spaced apart from each other, a bank layer including a first barrier wall disposed on the first electrode and a second barrier wall disposed on the second electrode, and light emitting elements having ends disposed on the first electrode and the second electrode between the first and second barrier walls;
forming a contact electrode material layer disposed on the light emitting elements and the bank layer, an insulating material layer disposed on the contact electrode material layer, and a connection electrode material layer disposed on the insulating material layer;
patterning the connection electrode material layer and the insulating material layer to remove a portion overlapping the light emitting elements, and forming a connection electrode layer including connection electrodes spaced apart from each other, and an intermediate layer including pattern portions spaced apart from each other; and
patterning the contact electrode material layer using the connection electrode layer as a mask to form a contact electrode layer in contact with the light emitting elements and including contact electrodes spaced apart from each other.

17. The method of claim 16, wherein
the insulating material layer includes an organic insulating material, and
a drying process of the insulating material layer is performed after the patterning of the connection electrode material layer and the insulating material layer.

18. The method of claim 17, wherein
the connection electrode material layer includes a-ITO, and
the contact electrode material layer includes IZO.

19. The method of claim 16, wherein facing side edges of the connection electrodes spaced apart from each other are parallel to facing side edges of the pattern portions spaced apart from each other, and facing side edges of the contact electrodes spaced apart from each other.

20. The method of claim 19, wherein a gap between the contact electrodes spaced apart from each other is smaller than a gap between the first barrier wall and the second barrier wall.

* * * * *